United States Patent
Kondo

(10) Patent No.: US 10,547,245 B2
(45) Date of Patent: Jan. 28, 2020

(54) POWER CONVERTER

(71) Applicant: DENSO CORPORATION, Kariya, Aichi-pref. (JP)

(72) Inventor: Yohei Kondo, Kariya (JP)

(73) Assignee: DENSO CORPORATION, Kariya (JP)

( * ) Notice: Subject to any disclaimer, the term of this patent is extended or adjusted under 35 U.S.C. 154(b) by 58 days.

(21) Appl. No.: 15/991,098

(22) Filed: May 29, 2018

(65) Prior Publication Data

US 2018/0342960 A1 Nov. 29, 2018

(30) Foreign Application Priority Data

May 29, 2017 (JP) ................................. 2017-105984

(51) Int. Cl.
| | |
|---|---|
| *H02M 7/00* | (2006.01) |
| *H02M 7/46* | (2006.01) |
| *H05K 7/14* | (2006.01) |
| *H05K 7/02* | (2006.01) |
| *H02M 1/088* | (2006.01) |

(52) U.S. Cl.
CPC ............ *H02M 7/003* (2013.01); *H02M 7/46* (2013.01); *H05K 7/02* (2013.01); *H05K 7/1432* (2013.01)

(58) Field of Classification Search
CPC ........ H02M 7/003; H02M 7/46; H02M 1/088; H05K 7/02; H05K 7/1432
See application file for complete search history.

(56) References Cited

U.S. PATENT DOCUMENTS

| | | | | |
|---|---|---|---|---|
| 2009/0296441 A1* | 12/2009 | Klemt | .................... | H02M 1/088 363/131 |
| 2012/0217918 A1* | 8/2012 | Januschevski | ......... | H02H 7/122 318/400.27 |
| 2015/0091481 A1* | 4/2015 | Tago | ........................ | H02P 6/28 318/400.2 |
| 2015/0305188 A1 | 10/2015 | Maeda et al. | | |
| 2016/0142048 A1* | 5/2016 | Zoels | ..................... | H02M 1/08 327/109 |
| 2016/0315037 A1 | 10/2016 | Kadoguchi et al. | | |

FOREIGN PATENT DOCUMENTS

| | | | |
|---|---|---|---|
| JP | 2013-017092 A | 1/2013 | |
| JP | 2014-064407 A | 4/2014 | |

* cited by examiner

*Primary Examiner* — Jue Zhang
*Assistant Examiner* — Bart Iliya
(74) *Attorney, Agent, or Firm* — Oliff PLC

(57) ABSTRACT

In a power converter including a plurality of switches, a plurality of freewheeling diodes each electrically connected in anti-parallel with a respective one of the switches, a freewheeling current input electrically connected to an output terminal of each of the switches, and a freewheeling current output electrically connected to an input terminal of each of the switches, a plurality of freewheeling current paths are defined, each of which is an electrical path passing through a respective one of the freewheeling diodes from the freewheeling current input to the freewheeling current output. At least one of the freewheeling current paths is a maximum path having a maximum impedance among the freewheeling current paths. A voltage drop across the freewheeling diode included in the maximum path is less than a voltage drop across each of the other freewheeling diodes when a freewheeling current flows through each of the plurality of freewheeling diodes.

6 Claims, 18 Drawing Sheets

⟨UPPER ARM: ON⟩

<UPPER ARM: OFF>

⟨UPPER ARM: ON, DL2: RECOVERY⟩

(VE1〉VE2)

⟨UPPER ARM: ON, DL1: RECOVERY⟩

<FIRST COMPARATIVE TECHNIQUE>

(VE2=VE3)

⟨SECOND COMPARATIVE TECHNIQUE⟩

POWER CONVERTER

CROSS-REFERENCE TO RELATED APPLICATION

This application is based on and claims the benefit of priority from earlier Japanese Patent Application No. 2017-105984 filed on May 29, 2017, the description of which is incorporated herein by reference.

BACKGROUND

Technical Field

The present disclosure relates to a power converter.

Related Art

Conventionally, a power converter is known which comprises a plurality of switches and freewheeling diodes each electrically connected in anti-parallel with an respective one of the switches (see, for example, Japanese Patent Application Laid-Open Publication No. 2013-17092).

A recovery current flows through each of the freewheeling diodes. Upon completion of passage of the recovery current, a surge voltage may be generated on an electrical path through which the recovery current flows. A potential on an output terminal of one of the plurality of switches connected in parallel with each other, which corresponds to the freewheeling diode where the surge voltage has been generated, may become relatively lower than a potential on an output terminal of another one of the switches. Thus, a potential difference may be generated between the output terminals of different switches. This is because the output terminals of the switches are electrically connected to each other.

The timing of completion of passage of the recovery current may not be matched between at least two of the freewheeling diodes due to a characteristic difference between individual freewheeling diodes. Upon sequential completion of passage of recovery current through the respective freewheeling diodes, the potential difference between the output terminals of the respective switches may significantly vary. Large variations in the potential difference may cause a voltage applied to a terminal of a respective switch, such as a control terminal or an output terminal, to exceed a rated value. This may lead to degradation or malfunctioning of the switches.

In view of the above, a power converter capable of suppressing variations in potential difference between output terminals of a plurality of switches electrically connected in parallel with each other is desired.

SUMMARY

One aspect of the disclosure provides a power converter including: a plurality of switches; a plurality of freewheeling diodes, each of which is electrically connected in anti-parallel with a respective one of the switches; a freewheeling current input electrically connected to an output terminal of each of the switches; a freewheeling current output electrically connected to an input terminal of each of the switches. In the power converter, a plurality of freewheeling current paths are defined, each of which is an electrical path passing through a respective one of the freewheeling diodes from the freewheeling current input to the freewheeling current output, at least one of the plurality of freewheeling current paths is a maximum path having a maximum impedance among the freewheeling current paths, and a voltage drop across the freewheeling diode included in the maximum path is less than a voltage drop across each of the other freewheeling diodes when a freewheeling current flows through each of the plurality of freewheeling diodes.

In this aspect, the output terminals of the respective switches are electrically connected to the freewheeling current input, and the input terminals of the respective switches are electrically connected to the freewheeling current output. Therefore, the plurality of switches are electrically connected in parallel with each other.

A value of freewheeling current through each of the plurality of freewheeling diodes may vary due to differences in characteristic between the individual freewheeling diodes, which may give rise to differences in freewheeling current value between the plurality of freewheeling diodes. As the differences in freewheeling current value increase, the timing of completion of passage of recovery current may significantly vary with the freewheeling diodes, which may result in large variations in potential difference between the output terminals of the respective switches.

To suppress variations in potential difference between the output terminals of the respective switches, in this aspect, the power converter is configured as follows. The plurality of freewheeling current paths include at least one freewheeling current path that is a maximum path having a maximum impedance among the freewheeling current paths.

Given such a maximum path having a maximum impedance among the freewheeling current paths, a voltage drop across the freewheeling diode included in the maximum path is less than a voltage drop across each of the other freewheeling diodes when a freewheeling current flows through each of the plurality of freewheeling diodes. This configuration can suppress variations in impedance with the freewheeling current paths, thus suppressing variations in voltage drop generated when a freewheeling current flows through each of the freewheeling current paths with the freewheeling current paths. This can suppress variations in difference between the values of freewheeling currents through the respective freewheeling diodes and can therefore suppress variations in timing of completion of passage of the recovery current with the freewheeling current paths. As a result, variations in potential difference between the output terminals of the respective switches can be suppressed.

DESCRIPTION OF SPECIFIC EMBODIMENTS

With reference to the accompanying drawings, hereinafter are described several embodiments of the present disclosure. Substantially common elements throughout the embodiments are assigned the same numbers and will not be redundantly described.

First Embodiment

A vehicle-mounted motor control system including a power converter in accordance with a first embodiment of the present disclosure will now be described.

Figure 1:
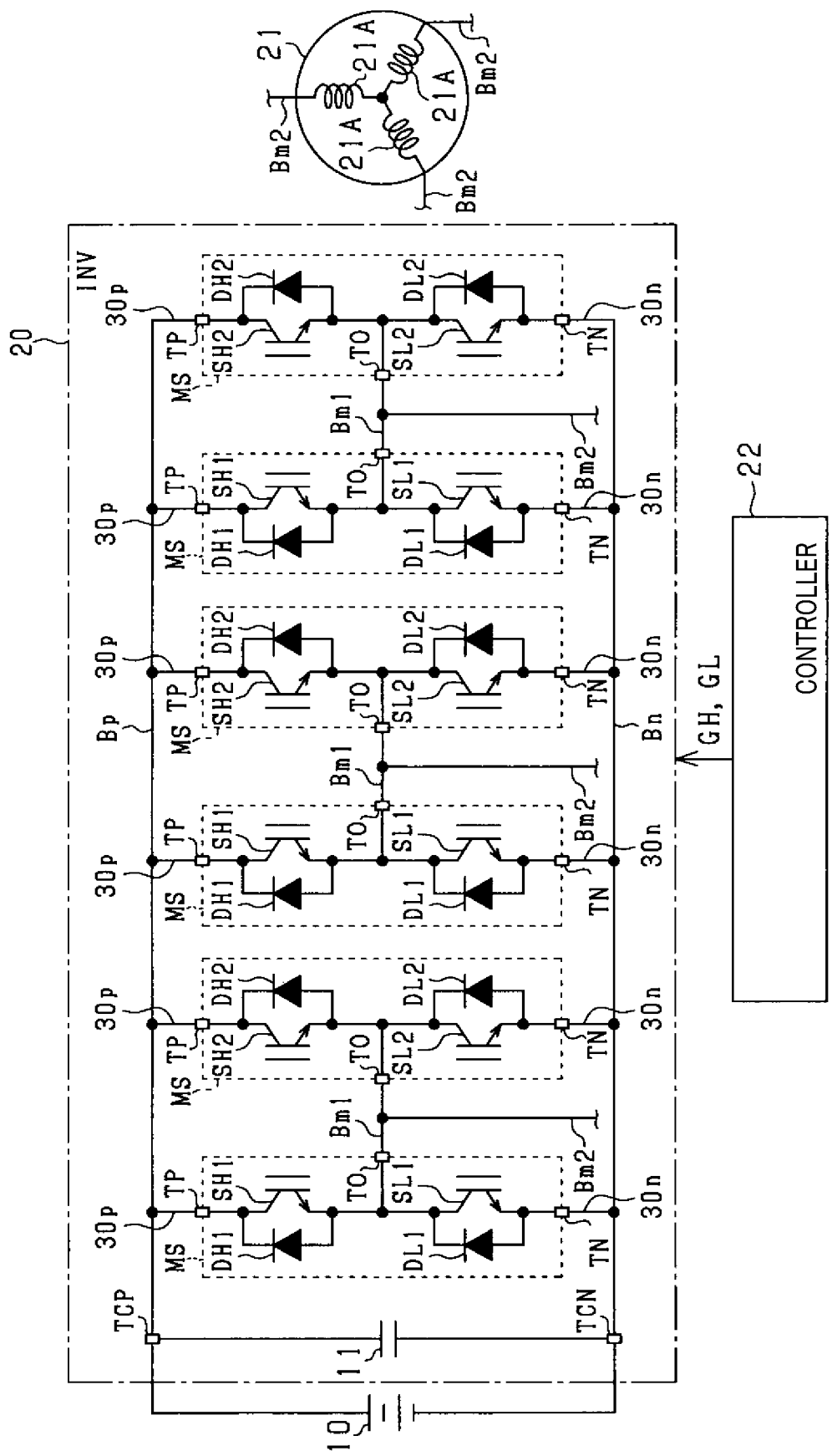
FIG. 1 is an overall configuration diagram of a motor control system in accordance with a first embodiment.

As shown in FIG. 1, the control system includes a battery 10, an inverter 20 as the power converter, a rotary electric machine 21, and a controller 22. The battery 10 has a voltage of 100 V or higher across the terminals. More specifically, the battery 10 may be a lithium-ion battery or a nickel-hydrogen battery. A capacitor 11, as a DC power source, is connected in parallel with the battery 10.

The rotary electric machine 21 serves as a vehicle prime mover and can transmit dynamical power to a drive wheel (not shown). In the present embodiment, the rotary electric machine 21 may be a three-phase permanent magnet synchronous machine.

The inverter 20 is configured to convert direct-current (DC) power from the capacitor 11 into alternating-current (AC) power to output the AC power to the rotary electric machine 21. In the present embodiment, the inverter 20 is a three-phase inverter. The inverter 20 includes, for each of the three phases, a series connection of a first upper arm switch SH1 and a first lower arm switch SL1 and a series connection of a second upper arm switch SH2 and a second lower arm switch SL2. The series connection of the first upper arm switch SH1 and the first lower arm switch SL1 and the series connection of the second upper arm switch SH2 and the second lower arm switch SL2 are electrically connected in parallel with each other. In the present embodiment, each of the switches SH1, SH2, SL1, SL2 is a voltage control type semiconductor switch element, more specifically, an insulated gate bipolar transistor (IGBT). In each switch, a control terminal is a gate, an input terminal is a collector, and an output terminal is an emitter.

A first upper arm diode DH1 is electrically connected in anti-parallel with the first upper arm switch SH1. A first lower arm diode DL1 is electrically connected in anti-parallel with the first lower arm switch SL1. A second upper arm diode DH2 is electrically connected in anti-parallel with the second upper arm switch SH2. A second lower arm diode DL2 is electrically connected in anti-parallel with the second lower arm switch SL2.

In the present embodiment, each of the diodes DH1, DH2, DL1, DL2 corresponds to a freewheeling diode. Each of the diodes DH1, DH2, DL1, DL2 may be integrated within a corresponding one of the switches SH1, SH2, SL1, SL2 to provide an IGBT with a built-in diode or may be external to a corresponding one of the switches SH1, SH2, SL1, SL2.

Figure 2:
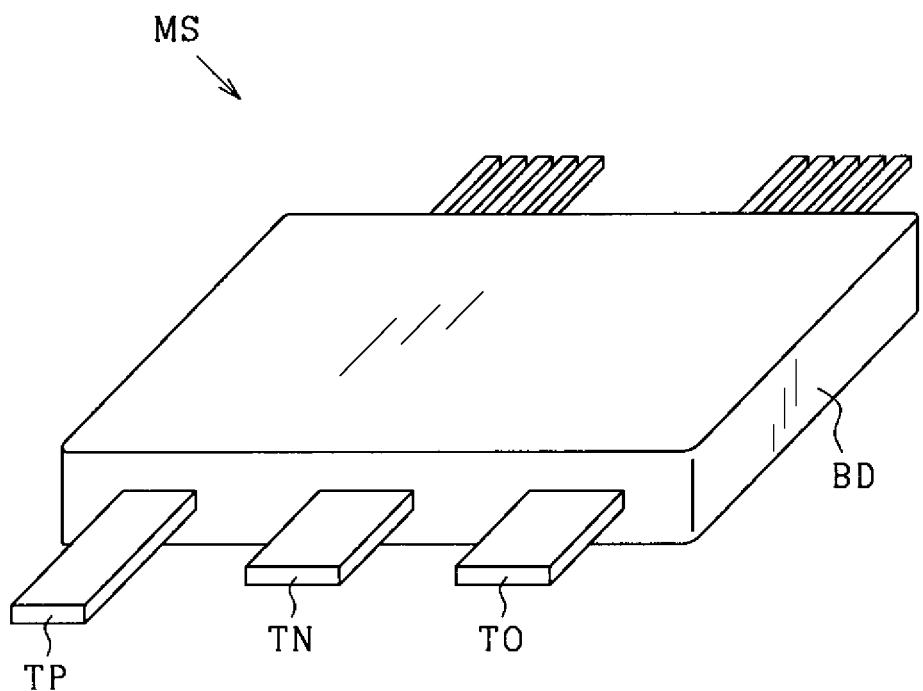
FIG. 2 is a perspective view of a semiconductor module.

In the present embodiment, as shown in FIG. 2, the first upper arm switch SH1, the first upper arm diode DH1, the first lower arm switch SL1, and the first lower arm diode DL1 are integrated within a body BD to provide a semiconductor module MS. The second upper arm switch SH2, the second upper arm diode DH2, the second lower arm switch SL2, and the second lower arm diode DL2 are integrated within a body BD to provide a semiconductor module MS. In the present embodiment, each body BD is flattened cuboid shaped.

Each semiconductor module MS has a switch high-voltage terminal TP, a switch low-voltage terminal TN, and an intermediate terminal TO. The switch high-voltage terminal TP, the switch low-voltage terminal TN, and the intermediate terminal TO protrude from the body BD. The switch high-voltage terminal TP is electrically connected to the collector of the upper arm switch. The switch low-voltage terminal TN is electrically connected to the emitter of the lower arm switch. The intermediate terminal TO is electrically connected to the emitter of the upper arm switch and the collector of the lower arm switch.

In each semiconductor module MS, as shown in FIGS. 1-4, the switch high-voltage terminal TP is electrically connected to a high-voltage conductive member Bp via a conductive high-voltage connection 30p. The high-voltage conductive member Bp is electrically connected to a high-voltage power source terminal TCP that is a high side terminal of the capacitor 11. In each semiconductor module MS, the switch low-voltage terminal TN is electrically connected to a low-voltage conductive member Bn via a conductive low-voltage connection 30n. The low-voltage conductive member Bn is electrically connected to a low-voltage power source terminal TCN that is a low side terminal of the capacitor 11. A positive terminal of the battery 10 is electrically connected to the high-voltage power source terminal TCP. A negative terminal of the battery 10 is electrically connected to the low-voltage power source terminal TCN.

For each of the three phases, intermediate terminals TO of the two semiconductor modules MS are electrically connected to a first conductive connection Bm1. The first connection Bm1 is electrically connected to a first end of a winding 21A of the rotary electric machine 21 via a second conductive connection Bm2. A second end of the winding 21A of the rotary electric machine 21 is electrically connected to a neutral point. The winding 21A is an inductive load. The first connection Bm1 and the second connection Bm2 may be integrated with each other or be separate members.

Figure 3:
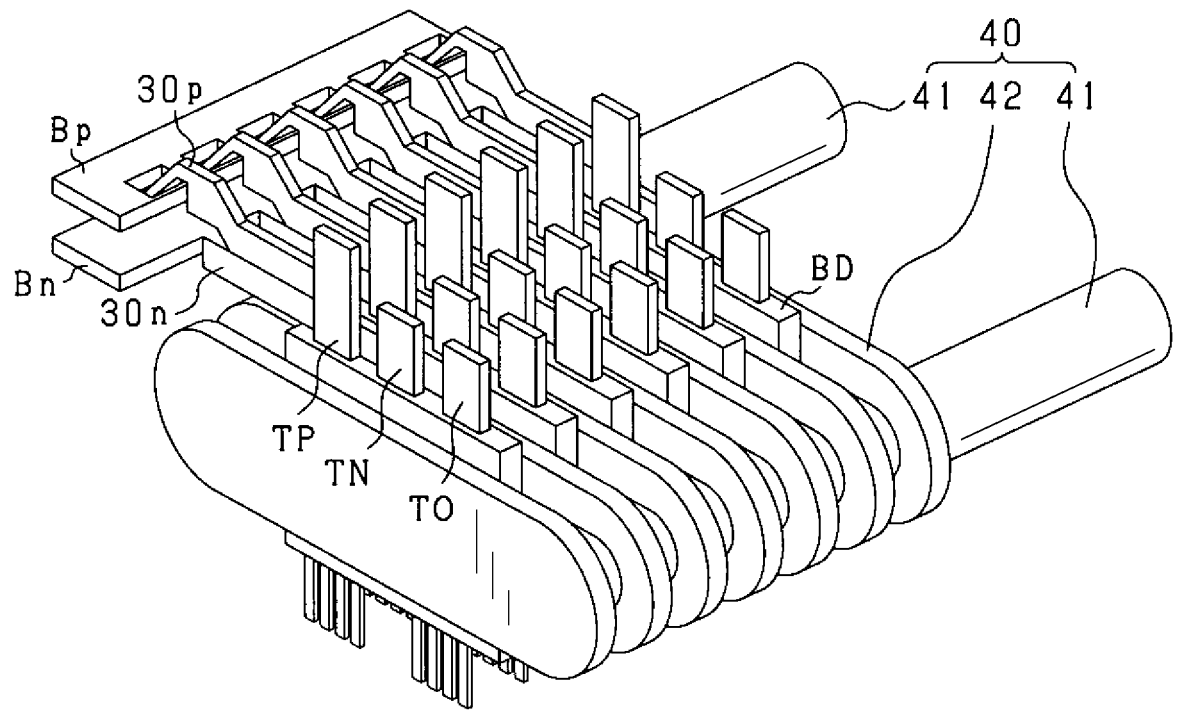
FIG. 3 is a perspective view of a cooling arrangement for cooling semiconductor modules.
Figure 4:
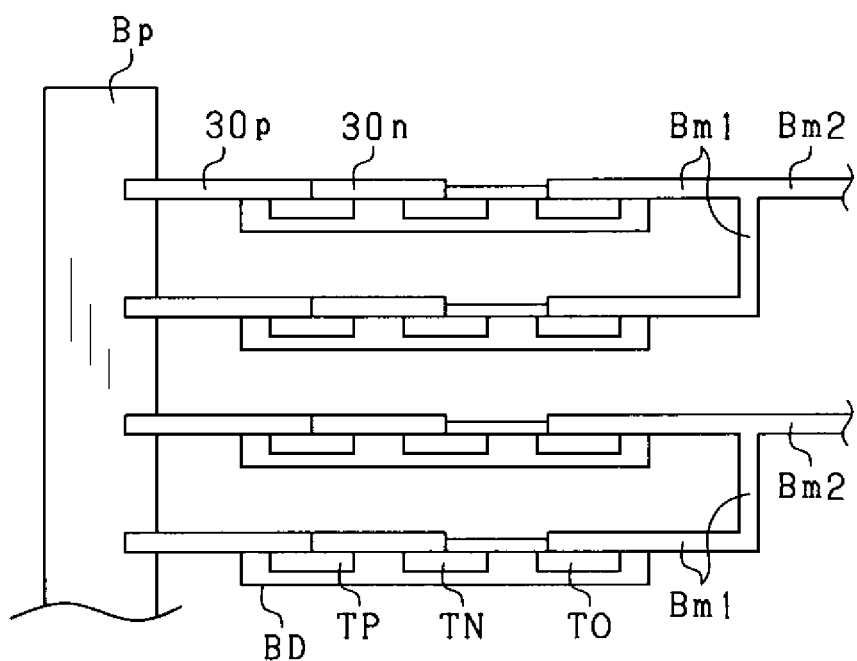
FIG. 4 is a plan view of semiconductor modules and connections.

In the present embodiment, the control system includes a cooling arrangement 40. The cooling arrangement 40, as shown in FIG. 3, includes a pair of cooling conduits 41 and a plurality of cooling plates 42. Each semiconductor module MS is sandwiched between a pair of cooling plates 42. The cooling conduits 41 and the cooling plates 42 form a cooling passage thorough which a cooling fluid flows.

Figure 5:
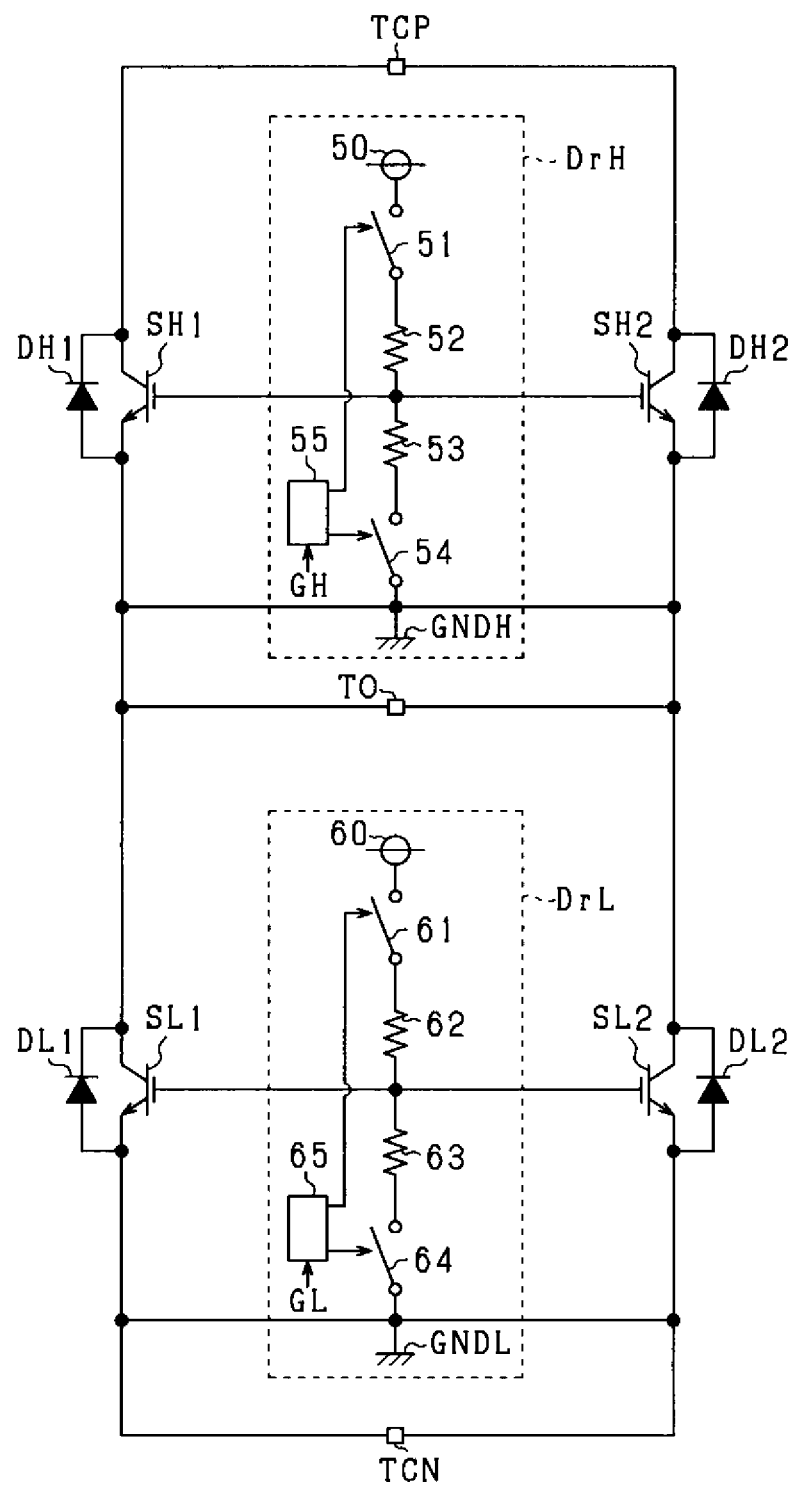
FIG. 5 is a drive circuit diagram.

As shown in FIG. 5, the inverter 20 includes, for each of the three phases, an upper arm drive circuit DrH configured to drive the first upper arm switch SH1 and the second upper arm switch SH2 and a lower arm drive circuit DrL configured to drive the first lower arm switch SL1 and the second lower arm switch SL2.

The controller 22 is configured to on-off drive the respective switches SH1, SH2, SL1, SL2 of the inverter 20 to control a controlled variable, such as a torque, of the rotary electric machine 21, to a command value for the controlled variable. The controller 22 outputs, for each of the three phases, an upper arm drive signal GH for the first and second upper arm switches SH1, SH2 to the upper arm drive circuit DrH. The controller 22 outputs, for each of the three phases, a lower arm drive signal GL for the first and second lower arm switches SL1, SL2 to the lower drive circuit DrL. The controller 22 generates the drive signals GH, GL for the respective drive circuits DrH, DrL by pulse width modulation (PWM) processing based on comparing whether each of three-phase command voltages that are 120 degrees in electrical angle out of phase is above or below a carrier signal such as a triangular wave. Each of the drive signals GH, GL takes either an on drive command for instruction to switch to an on state or an off drive command for instruction to switch to an off state. For each of the three phases, the upper arm drive signal GH and the lower arm drive signal GL are complementary to each other. Thus, for each of the three phases, the first and second upper arm switches SH1, SH2 and the first and second lower arm switches SL1, SL2 are alternately put in the on state with a dead time between their on states.

The drive circuits DrH, DrL will now be described with reference to FIG. 5. In FIG. 5, for simplification, the intermediate terminal TO of the semiconductor module MS including the first upper and lower arm switches SH1, SL1 and the intermediate terminal TO of the semiconductor module MS including the second upper and lower arm switches SH2, SL2 are represented by a single intermediate terminal TO.

The upper arm drive circuit DrH includes an upper power source 50, an upper charging switch 51, and an upper charging resistor 52. The upper power source 50 is electrically connected to a first end of the upper charging resistor 52 through the upper charging switch 51. A second end of the upper charging resistor 52 is electrically connected to the gate of the first upper arm switch SH1 and the gate of the second upper arm switch SH2.

The upper arm drive circuit DrH includes an upper discharging resistor 53 and an upper discharging switch 54. A first end of the upper discharging resistor 53 is electrically connected to the gate of the first upper arm switch SH1 and the gate of the second upper arm switch SH2. A second end of the upper discharging resistor 53 is electrically connected to a ground GNDH of the upper arm drive circuit DrH through the upper discharging switch 54. The emitter of the first upper arm switch SH1 and the emitter of the second upper arm switch SH2 are electrically connected to the ground GNDH.

The upper arm drive circuit DrH includes an upper controller 55. The upper controller 55 is configured to on-off drive the respective upper arm switches SH1, SH2 by alternately performing charging and discharging processes in response to the upper arm drive signal GH from the controller 22. More specifically, in the charging process, when the upper controller 55 determines that the upper arm drive signal GH is the on drive command, the upper controller 55 puts the upper charging switch 51 in the on state and puts the upper discharging switch 54 in the off state. This allows a charging current to flow from the upper power source 50 to the gate of each of the upper arm switches SH1, SH2, such that a gate voltage of each of the upper arm switches SH1, SH2 becomes equal to or greater than a threshold voltage. Thus, each of the upper arm switches SH1, SH2 transitions from the off state to the on state.

In the discharging process, when the upper controller 55 determines that the upper arm drive signal GH is the off drive command, the upper controller 55 puts the upper charging switch 51 in the off state and puts the upper discharging switch 54 in the on state. This allows a discharge current to flow from the gate to the emitter of each of the upper arm switches SH1, SH2, such that the gate voltage of each of the upper arm switches SH1, SH2 drops below the threshold voltage. Thus, each of the upper arm switches SH1, SH2 transitions from the on state to the off state.

The lower arm drive circuit DrL includes a lower power source 60, a lower charging switch 61, a lower charging resistor 62, a lower discharging resistor 63, and a lower discharging switch 64. The lower arm drive circuit DrL is similar in configuration to the upper arm drive circuit DrH and will not thus be redundantly described. In FIG. 5, a ground for the lower arm drive circuit DrL is denoted by GNDL.

The lower arm drive circuit DrL includes a lower controller 65. The lower controller 65 is configured to on-off drive the respective lower arm switches SL1, SL2 by alternately performing charging and discharging processes in response to the lower arm drive signal GL from the controller 22. More specifically, in the charging process, when the lower controller 65 determines that the lower arm drive signal GL is the on drive command, the lower controller 65 puts the lower charging switch 61 in the on state and puts the lower discharging switch 64 in the off state. This allows a charging current to flow from the lower power source 60 to the gate of each of the lower arm switches SL1, SL2, such that a gate voltage of each of the lower arm switches SL1, SL2 becomes equal to or greater than a threshold voltage. Thus, each of the lower arm switches SL1, SL2 transitions from the off state to the on state.

In the discharging process, when the lower controller 65 determines that the lower arm drive signal GL is the off drive command, the lower controller 65 puts the lower charging switch 61 in the off state and puts the lower discharging switch 64 in the on state. This allows a discharge current to flow from the gate to the emitter of each of the lower arm switches SL1, SL2, such that the gate voltage of each of the lower arm switches SL1, SL2 drops below the threshold voltage. Thus, each of the lower arm switches SL1, SL2 transitions from the on state to the off state.

Figure 6:
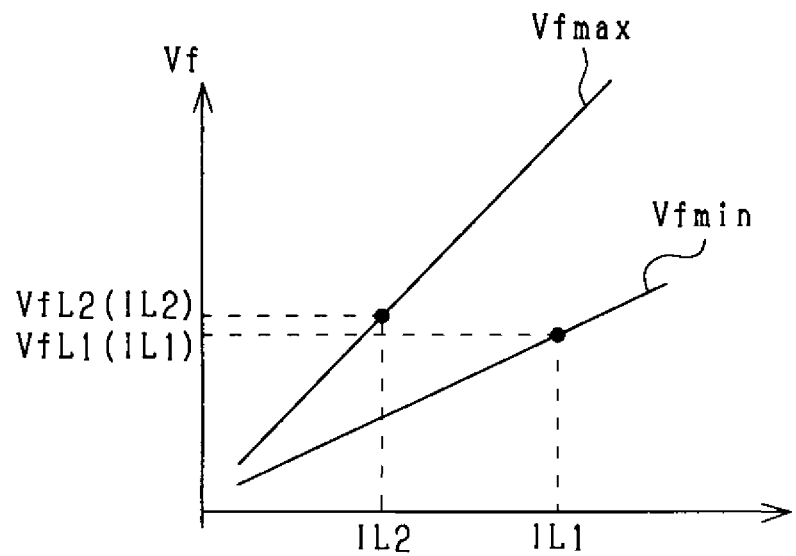
FIG. 6 is an example of variations in diode current-voltage characteristics.

Referring to FIG. 6, each of the diodes DH1, DH2, DL1, DL2 has a current-voltage characteristic represented by a relationship between freewheeling current and voltage drop Vf. Such a characteristic may vary with individual mass-produced diodes. The mass-produced diodes may include a diode with a maximum characteristic Vfmax and a diode with a minimum characteristic Vfmin as shown in FIG. 6. The maximum characteristic Vfmax is defined as a current-voltage characteristic of a diode that exhibits a maximum voltage drop at a specific value of freewheeling current. The minimum characteristic Vfmin is defined as a current-voltage characteristic of a diode that exhibits a minimum voltage drop at the specific value of freewheeling current.

Since the current-voltage characteristic varies with the mass-produced diodes, each of the first lower arm diode DL1 and the second lower arm diode DL2 may exhibit a different voltage drop at a certain value of freewheeling current. That is, at a certain value of freewheeling current, a voltage drop across one of the first lower arm diode DL1 and the second lower arm diode DL2 may be greater than a voltage drop across the other one of the first lower arm diode DL1 and the second lower arm diode DL2. In such a case, an imbalance phenomenon may occur, such that there is a large difference in freewheeling current value between the first and the second lower arm diodes DL1, DL2. In the following, some issues caused by such an imbalance phenomenon will now be described.

Figure 7:
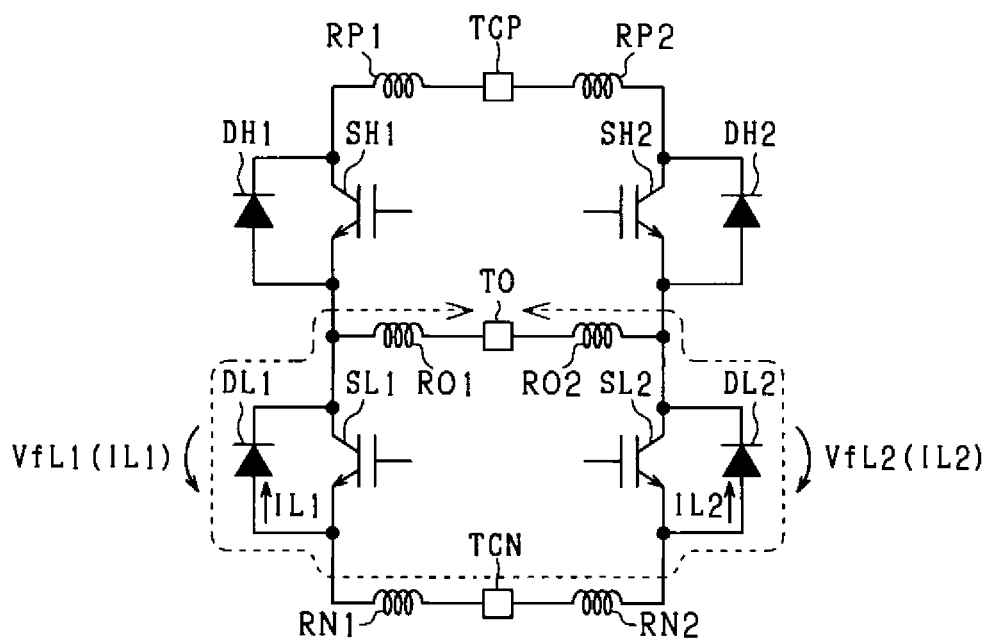
FIG. 7 is a circuit diagram for any one of three phases.

FIG. 7 illustrates switches SH1, SL1, SH2, SL2 for any one of the three-phases. For sake of simplicity, in FIG. 7, the intermediate terminal TO of the semiconductor module MS including the first upper and lower arm switches SH1, SL1 and the intermediate terminal TO of the semiconductor module MS including the second upper and lower arm switches SH2, SL2 are represented by a single intermediate terminal TO.

FIG. 7 illustrates a situation where a freewheeling current flows from the low-voltage power source terminal TCN to the intermediate terminal TO through the first lower arm diodes DL1 and a freewheeling current flows from the low-voltage power source terminal TCN to the intermediate terminal TO through the second lower arm diodes DL2. A value of freewheeling current flowing through the first lower arm diodes DL1 is denoted by IL1, and a value of freewheeling current flowing through the second lower arm diodes DL2 is denoted by IL2.

FIG. 7 also illustrates an impedance of each electrical path in the inverter 20. A first high-voltage impedance RP1 is an impedance of an electrical path from the high-voltage power source terminal TCP to the collector of the first upper arm switch SH1 via the high-voltage conductive member Bp, the high-voltage connection 30p, and the switch high-voltage terminal TP of the semiconductor module MS including the first upper arm diode DH1. The second high-voltage impedance RP2 is an impedance of an electrical path from the high-voltage power source terminal TCP to the collector of the second upper arm switch SH2 via the high-voltage conductive member Bp, the high-voltage connection 30p, and the switch high-voltage terminal TP of the semiconductor module MS including the second upper arm diode DH2. In FIG. 7, the magnitude of impedance is determined by magnitude settings of inductance of the electrical path. More specifically, the electrical path impedance increases with increasing electrical path inductance.

A first intermediate voltage impedance RO1 is an impedance of an electrical path from intermediate terminal TO to the emitter of the first upper arm switch SH1 or the collector of the first lower arm switch SL1 in the semiconductor module MS including the first upper arm diode DH1. A second intermediate voltage impedance RO2 is an impedance of an electrical path from the intermediate terminal TO to the emitter of the second upper arm switch SH2 or the collector of the second lower arm switch SL2 in the semiconductor module MS including the second upper arm diode DH2.

A first low voltage impedance RN1 is an impedance of an electrical path from the low-voltage power source terminal TCN to the emitter of the first lower arm switch SL1 via the low voltage conductive member Bn, the low voltage connection 30n, and the switch low-voltage terminal TN of the semiconductor module MS including the first lower arm diode DL1. A second low voltage impedance RN2 is an impedance of an electrical path from the low-voltage power source terminal TCN to the emitter of the second lower arm switch SL2 via the low voltage conductive member Bn, the low voltage connection 30n, and the switch low-voltage terminal TN of the semiconductor module MS including the second lower arm diode DL2.

The first lower arm diode DL1 and the second lower arm diode DL2 are electrically connected in parallel with each other. In a situation where there is a flow of freewheeling current thorough each of the first and second lower arm diodes DL1, DL2, a voltage drop Vfl1 (IL1) across the first lower arm diode DL1 and a voltage drop Vfl2 (IL2) across the second lower arm diode DL2 satisfies the following equation (1).

$$V_{fL1}(IL1) + IL1 \times (RO1+RN1) = V_{fL2}(IL2) + IL2 \times (RO2+RN2) \quad (eq\ 1)$$

As shown in FIG. 6, a larger freewheeling current flows through the first lower arm diode DL1 having a lower voltage drop than the second lower arm diode DL2. Thus, meeting the equation (1) may lead to a large difference between the freewheeling current IL1 flowing through the first lower arm diode DL1 and the freewheeling current IL2 flowing through the second lower arm diode DL2, which may cause an imbalance phenomenon.

Figure 8:
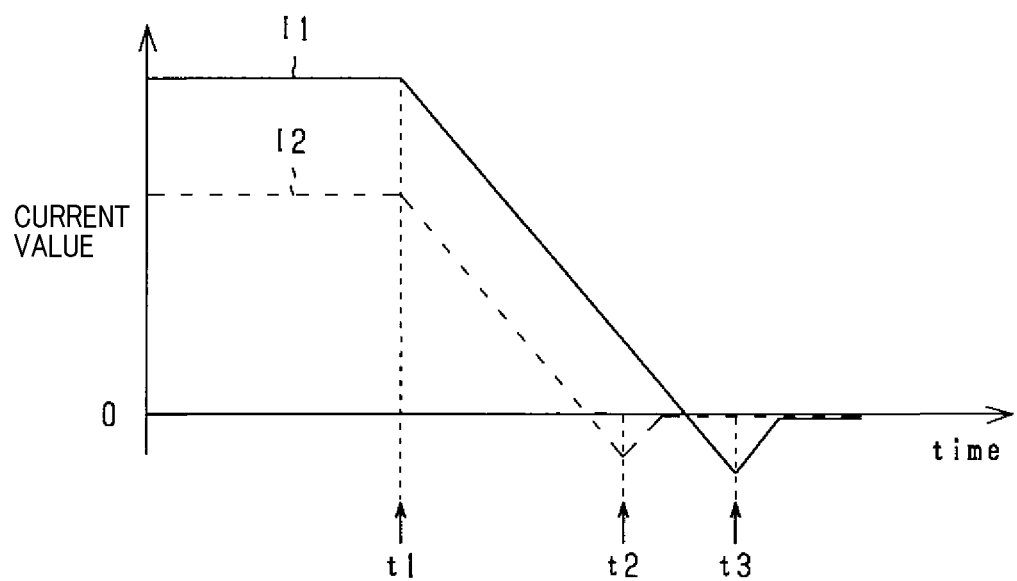
FIG. 8 is a timing diagram illustrating mismatched timing of completion of recovery current passages.

In a situation where the imbalance phenomenon is occurring, as shown in FIG. 8, when the first and second upper arm switches SH1, SH2 are put in the on state at time t1, the timing of beginning of decrease in absolute value of recovery current, as indicated by times t1, t2 in FIG. 6, is significantly mismatched. This may cause a large potential difference between the emitters of the first and second lower arm switches SL1, SL2.

A reason why a potential difference between the emitters of the first and second lower arm switches SL1, SL2 may significantly vary will now be described with reference to FIGS. 9-12.

Figure 9:
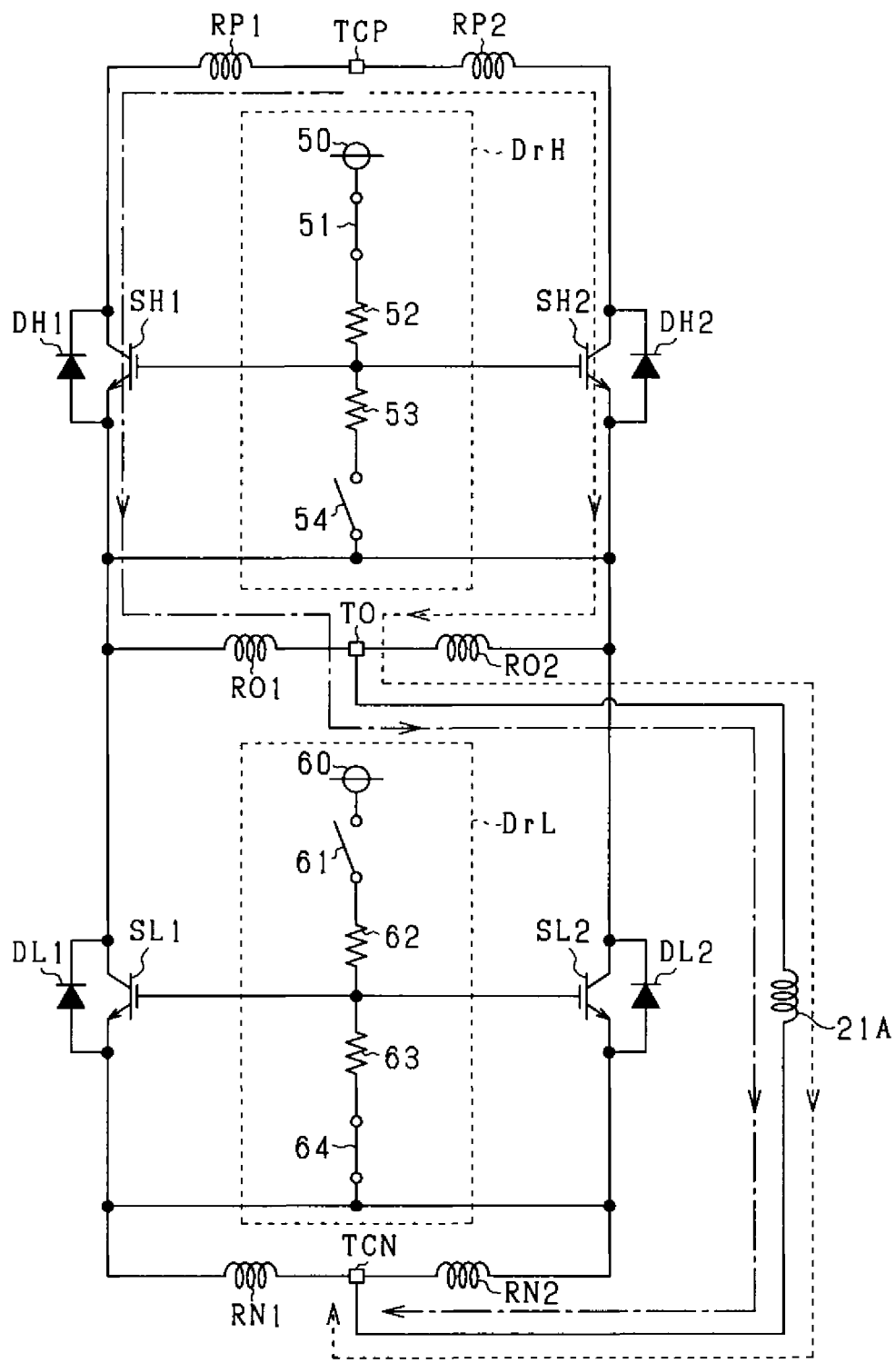
FIG. 9 is a circuit diagram illustrating a mechanism generating variations in emitter potential difference.

FIG. 9 illustrates, for any one of the three phases, a situation where the first and second upper arm switches SH1, SH2 are in the on state and the first and second lower arm switches SL1, SL2 are in the off state. In the example of FIG. 9, there is a flow of current from the high-voltage power source terminal TCP to the low-voltage power source terminal TCN through the first upper arm switch SH1, the intermediate terminal TO, the windings 21A for two phases of the rotary electric machine 21, and the first and second lower arm switches for the other phases (not shown). In the example of FIG. 9, there is another flow of current from the high-voltage power source terminal TCP to the low-voltage power source terminal TCN through the second upper arm switch SH2, the intermediate terminal TO, the windings 21A for two phases of the rotary electric machine 21, and the first and second lower arm switches for the other phases (not shown).

Figure 10:
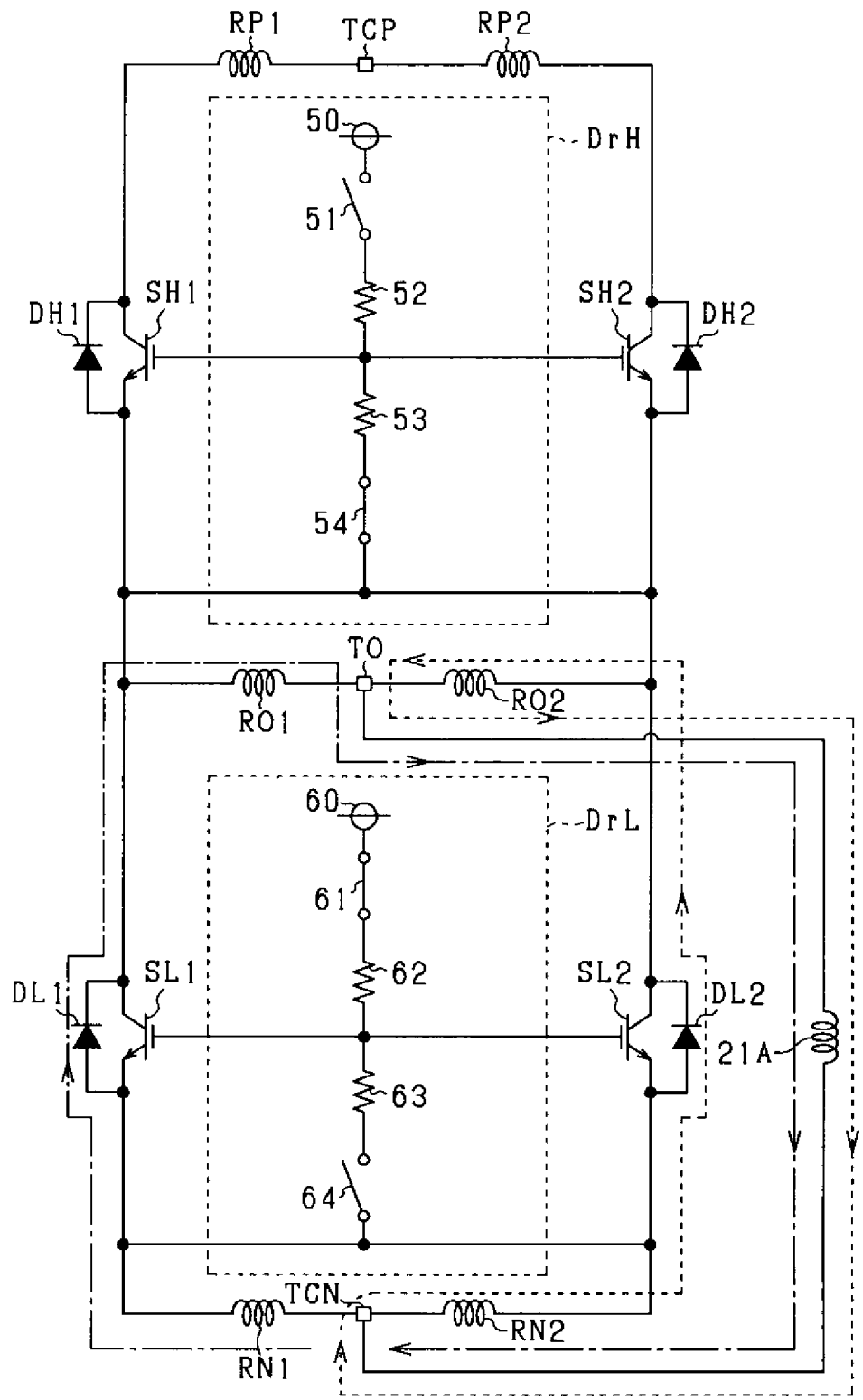
FIG. 10 is a circuit diagram illustrating a mechanism generating variations in emitter potential difference.

FIG. 10 illustrates a situation where the first and second upper arm switches SH1, SH2 are put in the off state and the first and second lower arm switches SL1, SL2 are in the on state. In the example of FIG. 10, the presence of windings 21A as an inductive load causes a flow of current through a loop path including the first lower arm diode DL1, the intermediate terminal TO, the windings 21A, and the first and second lower arm switches for the other phases (not shown). In the example of FIG. 10, there is another flow of current through a loop path including the second lower arm diode DL2, the intermediate terminal TO, the windings 21A, and the first and second lower arm switches for the other phases (not shown).

Figure 11:
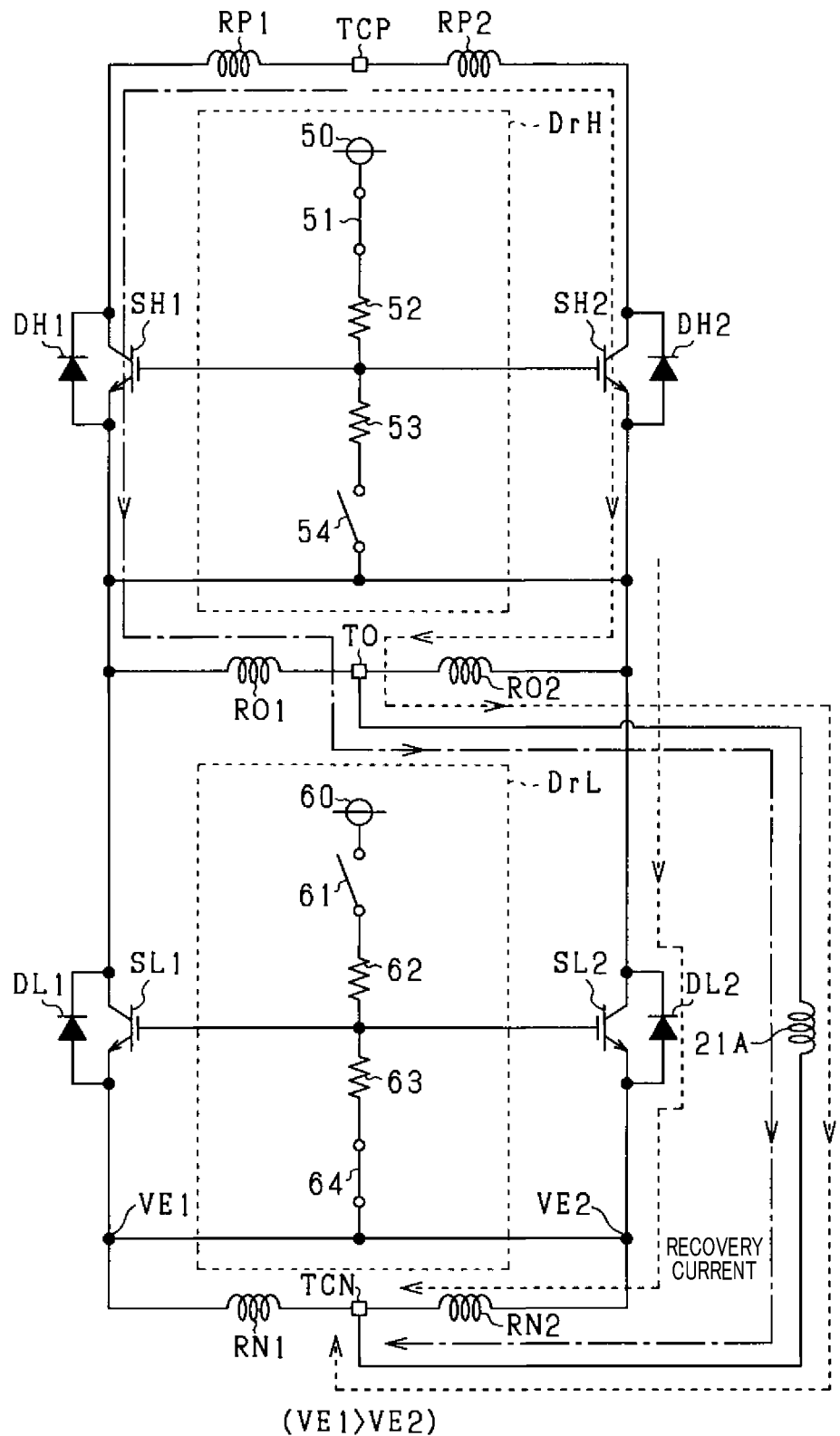
FIG. 11 is a circuit diagram illustrating a mechanism generating variations in emitter potential difference.

FIG. 11 illustrates a situation where the first and second upper arm switches SH1, SH2 are put again in the on state and the first and second lower arm switches SL1, SL2 are put again in the off state. In the example of FIG. 11, a reverse voltage applied to the second lower arm diode DL2 causes a flow of recovery current through the second lower arm diode DL2. Upon completion of passage of the recovery current, a surge voltage is thereby generated across the low voltage conductive member Bn. The surge voltage is proportional to a product value of a rate of decrease in recovery current dI/dt and an inductance of the low voltage conductive member Bn or the like. Due to the presence of the surge voltage, a potential VE2 on the emitter of the second lower arm switch SL2 becomes relatively lower than a potential VE1 on the emitter of the first lower arm switch SL1.

Figure 12:
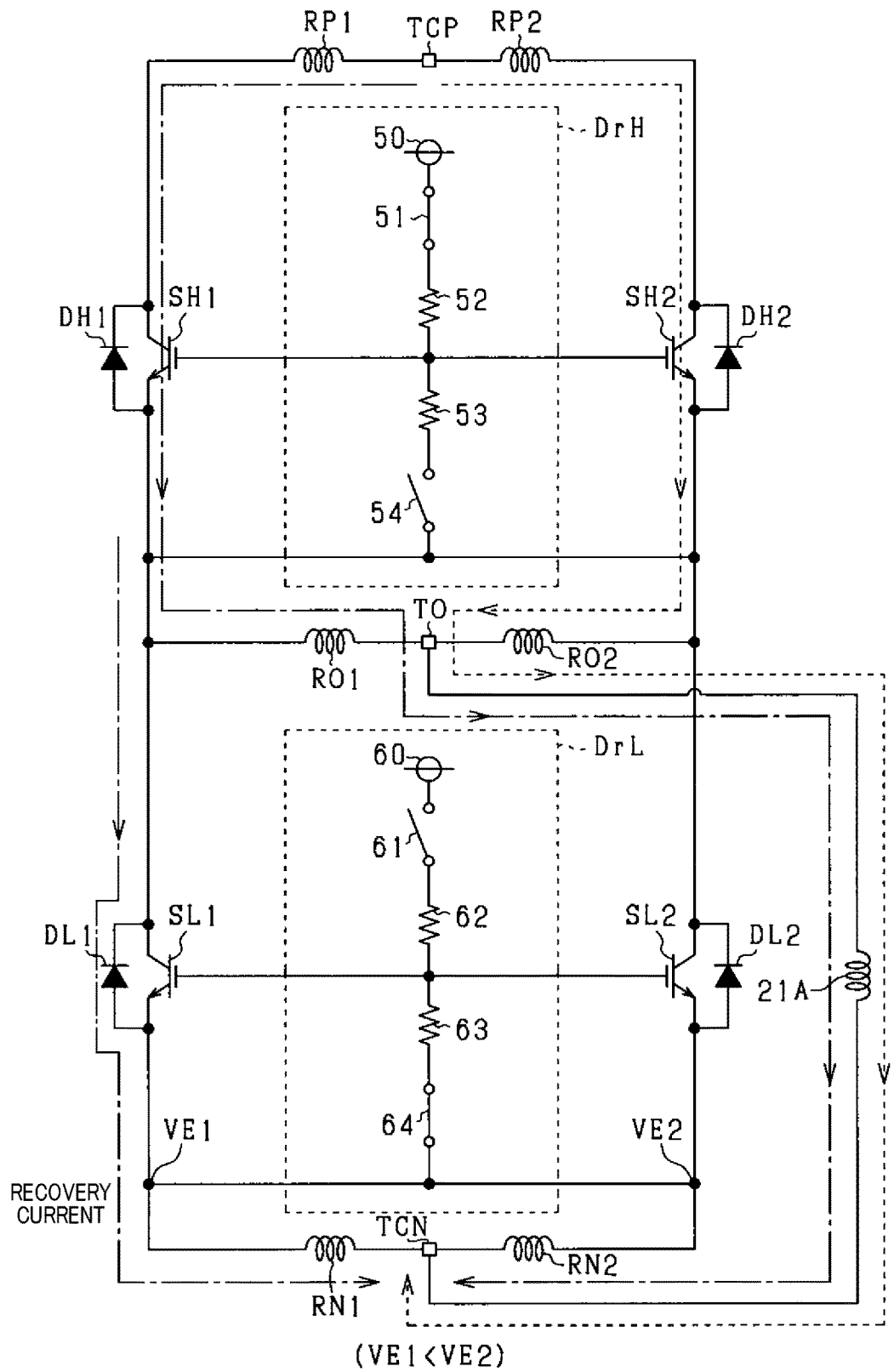
FIG. 12 is a circuit diagram illustrating a mechanism generating variations in emitter potential difference.

Thereafter, as shown in FIG. 12, a reverse voltage applied to the first lower arm diode DL1 causes a flow of recovery current through the first lower arm diode DL1. Upon completion of passage of the recovery current, a surge voltage is thereby generated across the low voltage conductive member Bn. Due to the presence of the surge voltage, a potential VE1 on the emitter of the first lower arm switch SL1 becomes relatively lower than a potential VE2 on the emitter of the second lower arm switch SL2. Thus, the completion timing of recovery current is significantly mismatched, which may result in a large variation in potential difference between the emitter of the first lower arm switch SL1 and the second lower arm switch SL2.

Such a large variation in potential difference between the emitter of the first lower arm switch SL1 and the second lower arm switch SL2 may cause an applied voltage on the gate terminal or the emitter of at least one of the first and second lower arm switch SL1, SL2 to exceed a rated value. This may result in malfunctioning of the first and second lower arm switches SL1, SL2 or degradation of the first and second lower arm switches SL1, SL2.

A value of freewheeling current flowing through the first upper arm diode DH1 is denoted by IH1, and a value of freewheeling current flowing through the second upper arm diode DH2 is denoted by IH2. A voltage drop across the first upper arm diode DH1, denoted by VfH1(IH1), and a voltage drop across the second upper arm diode DL2, denoted by VfH2(IH2), meet the following equation (2).

$$VfH1(IH1)+IH1\times(RO1+RP1)=VfH2(IH2)+IH2\times(RO2+RP2) \quad (eq\ 2)$$

It is assumed that the voltage drop VfH1(IH1) across the first upper arm diode DH1 and the voltage drop VfH2(IH2) across the second upper arm diode DL2 are different. In such a case, a large difference between the freewheeling current IH1 flowing through the first upper arm diode DH1 and the freewheeling current IH2 flowing through the second upper arm diode DH2 may be generated to meet the equation (2), which may cause an imbalance phenomenon. In a situation where the imbalance phenomenon is occurring, also when the first and second lower arm switches SL1, SL2 are put in the on state and the first and second upper arm switched SH1, SH2 are put in the off state, a large variation in potential difference between the emitters of the first and second upper arm switches SH1, SH2 may be generated.

First Comparative Technique

Figure 13:
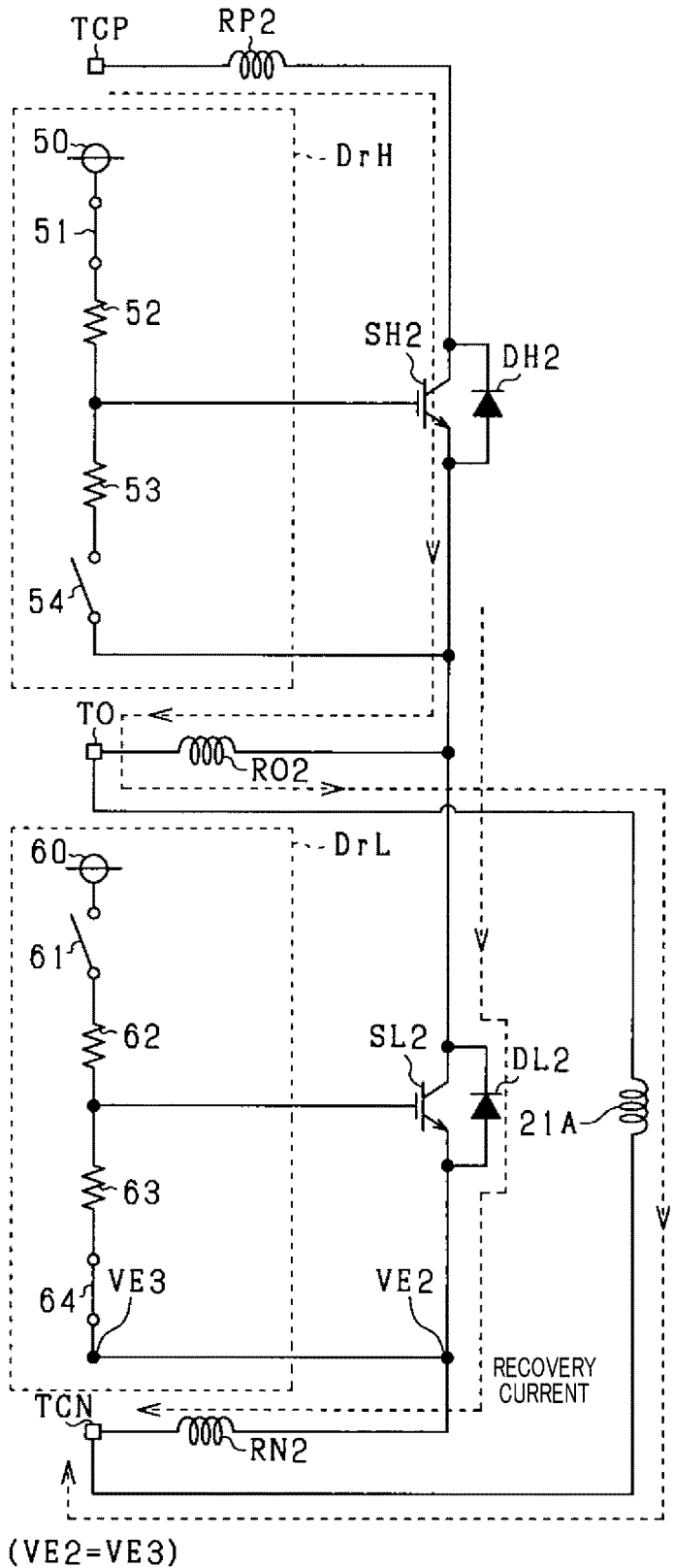
FIG. 13 is a schematic diagram of a drive circuit in accordance with a first comparative technique.

FIG. 13 illustrates a configuration where a pair of upper and lower arm switches are provided for each of the three phases. In such a configuration, even if a surge voltage is generated upon completion of passage of the recovery current, the potential difference between the emitter of the first lower arm switch SL1 and the emitter of the second lower arm switch SL2 does not significantly vary. This is because no difference between the potential VE2 on the emitter of the second lower arm switch SL2 and the potential VE3 on the opposite end of the lower discharging switch 64 from the lower discharging resistor 63 is generated even if a surge voltage is generated upon completion of passage of the recovery current.

Figure 14:
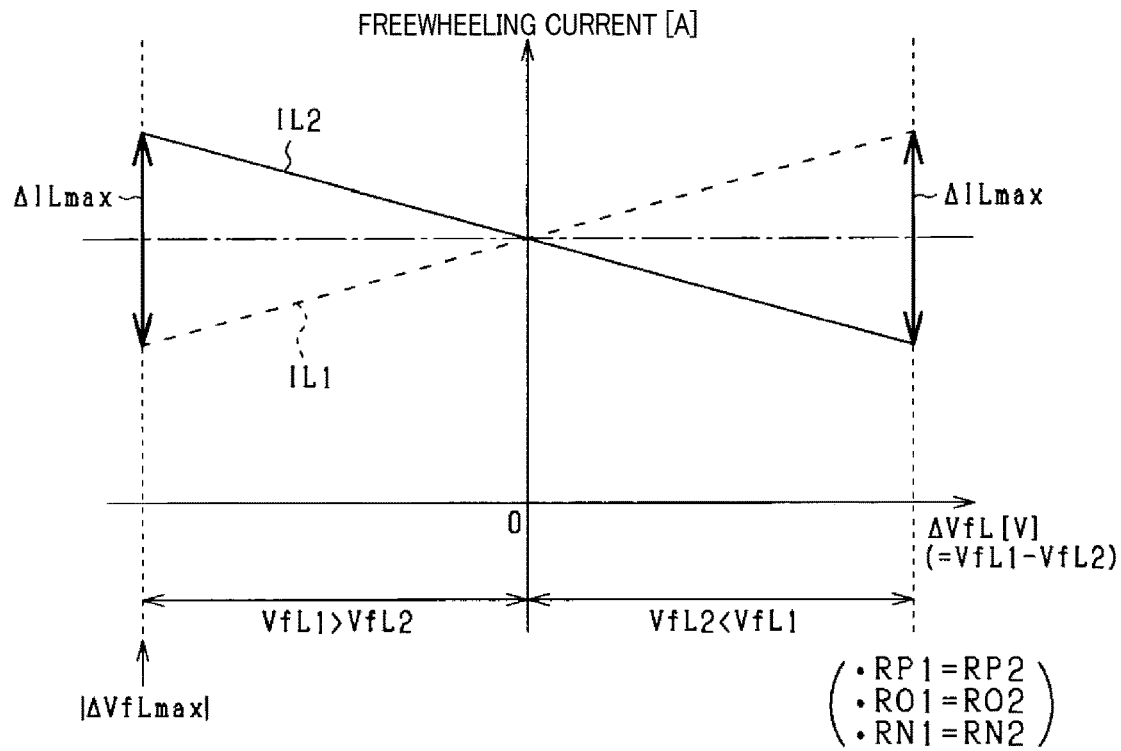
FIG. 14 is an example of defining diode characteristics in accordance with a second comparative technique.

Continuing with the lower arm example, a difference between freewheeling current values IL1, IL2, which may cause the imbalance phenomenon, depends on a lower arm potential difference ΔVfL which is an abscissa shown in FIG. 14. In the present embodiment, the lower arm potential difference ΔVfL is the voltage drop VfL1 across the first lower arm diode DL1 minus the voltage drop VfL2 across the second lower arm diode DL2. ΔVfL=0 means that the current-voltage characteristic of the first lower arm diode DL1 and the current-voltage characteristic of the second lower arm diode DL2 are the same. ΔVfL=|ΔVfLmax| means that the current-voltage characteristic of the first lower arm diode DL1 is the maximum characteristic Vfmax and the current-voltage characteristic of the second lower arm diode DL2 is the minimum characteristic Vfmin. ΔVfLmax is hereinafter referred to as a lower arm maximum potential difference ΔVfLmax.

Second Comparative Technique

FIG. 14 illustrates a relationship between lower arm potential difference ΔVfL in a second comparative technique and the freewheeling current values IL1, IL2. The second comparative technique is configured such that RP1=RP2, RO1=RO2, and RN1=RN2 in the equations (1), (2).

In the second comparative technique, when the first and second lower arm diodes DL1, DL2 that meet ΔVfL=0 are used, the value of freewheeling current IL1 through the first lower arm diode DL1 becomes equal to the value of freewheeling current IL2 through the second lower arm diode DL2. Thus, no imbalance phenomenon occurs.

In the second comparative technique, however, when one of the first and second lower arm diodes DL1, DL2 has the minimum characteristic Vfmin and the other one has the maximum characteristic Vfmax, an absolute difference value between the freewheeling current IL1 through the first lower arm diode DL1 and the freewheeling current IL2 through the second lower arm diode DL2 becomes a lower arm maximum current difference ΔILmax. The lower arm maximum current difference ΔILmax is a maximum value of an absolute difference between the freewheeling current IL1 through the first lower arm diode DL1 and the freewheeling current IL2 through the second lower arm diode DL2 under assumption that RO1=RO2 and RN1=RN2.

Thus, in the second comparative technique, the absolute difference value between the freewheeling currents IL1, IL2 may increase.

To reduce the absolute difference value between the freewheeling currents IL1, IL2, the configuration of the present embodiment will now be described.

For each of the three phases, the lower arm side employs the following conditions (A1)-(C1).

Figure 15:
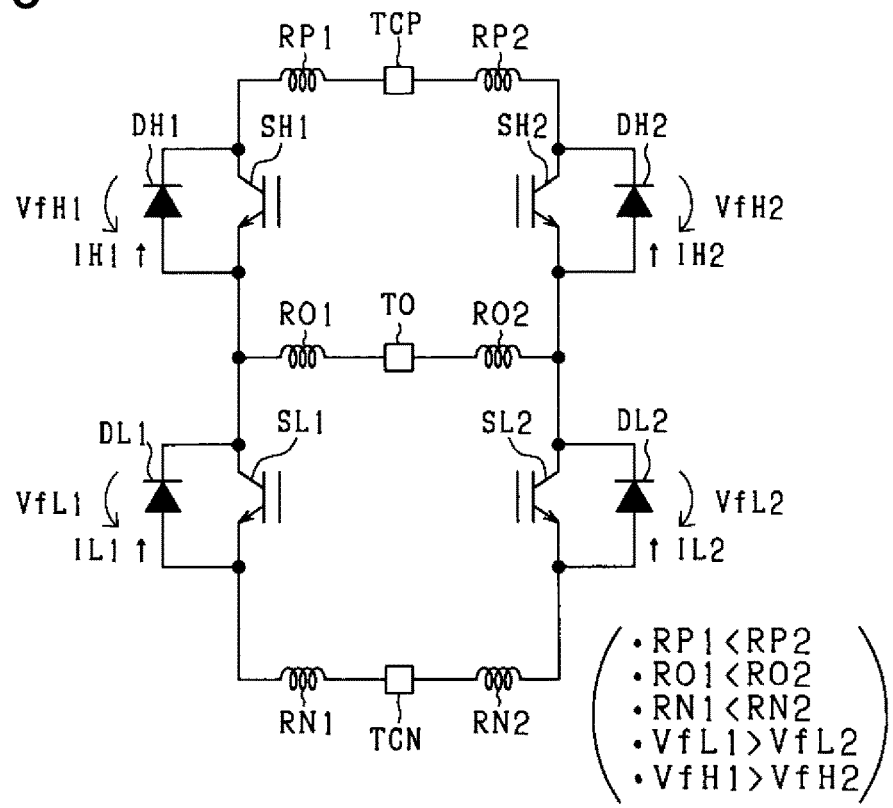
FIG. 15 is an example of defining impedances in accordance with the first embodiment.

(A1) As shown in FIG. 15, the first intermediate voltage impedance RO1 is set less than the second intermediate voltage impedance RO2, and the first low voltage impedance RN1 is set less than the second low voltage impedance RN2.

(B1) As shown FIG. 15, the voltage drop VfL1 across the first lower arm diode DL1 is set less than the voltage drop VfL2 across the second lower arm diode DL2 when a freewheeling current flows through each of the first and second lower arm diodes DL1, DL2. This can prevent the current-voltage characteristics of the first and second lower arm diodes DL1, DL2 from becoming VfL1>VfL2 or VfL2>VfL1, which can reduce factors causing a large variation in difference between the freewheeling current values IL1, IL2.

Figure 16:
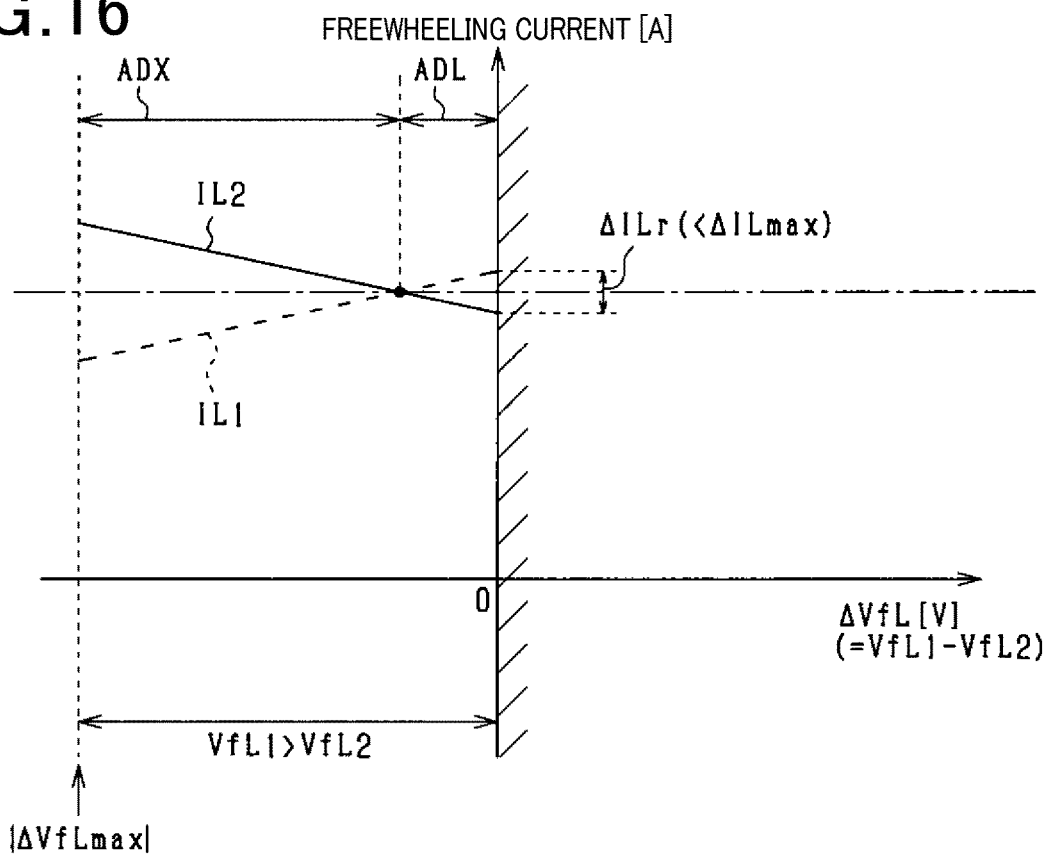
FIG. 16 is an example of defining diode characteristics.

(C1) As shown in FIG. 16, the current-voltage characteristics of the first and second lower arm diodes DL1, DL2 and the respective impedances RO1, RO2, RN1, RN2 are defined such that an absolute difference value between the voltage drop VfL1 across the first lower arm diode DL1 and the voltage drop VfL2 across the second lower arm diode DL2 when a freewheeling current flows through each of the first and second lower arm diodes DL1, DL2 is set equal to or less than an absolute difference value between the voltage drop VfL1 across the first lower arm diode DL1 and the voltage drop VfL2 across the second lower arm diode DL2 under assumption that the freewheeling current flowing through the first lower arm diode DL1 is as large as the freewheeling current flowing through the second lower arm diode DL2. In FIG. 16, a set range for the current-voltage characteristics of the first and second lower arm diodes DL1, DL2 to meet the condition (C1) is denoted by ADL. In FIG. 16, a range of ΔVfL in which VfL1>VfL2 consists of ranges ADL and ADX. When the freewheeling current through each of the first and second lower arm diodes DL1, DL2 is IML, the condition (C1) means that the following equation (3) is met.

$$\Delta VfL \leq IML \times \{(RO2+RN2)-(RO1+RN1)\} \qquad (eq\ 3)$$

With the conditions (A1)-(C1), as shown in FIG. 16, the current-voltage characteristics of the first and second lower arm diodes DL1, DL2 and the respective impedances RO1, RO2, RN1, RN2 are defined such that a maximum value ΔILr of an absolute difference between the voltage drop VfL1 across the first lower arm diode DL1 and the voltage drop VfL2 across the second lower arm diode DL2 is less than the lower arm maximum current difference ΔILmax.

Figure 17:
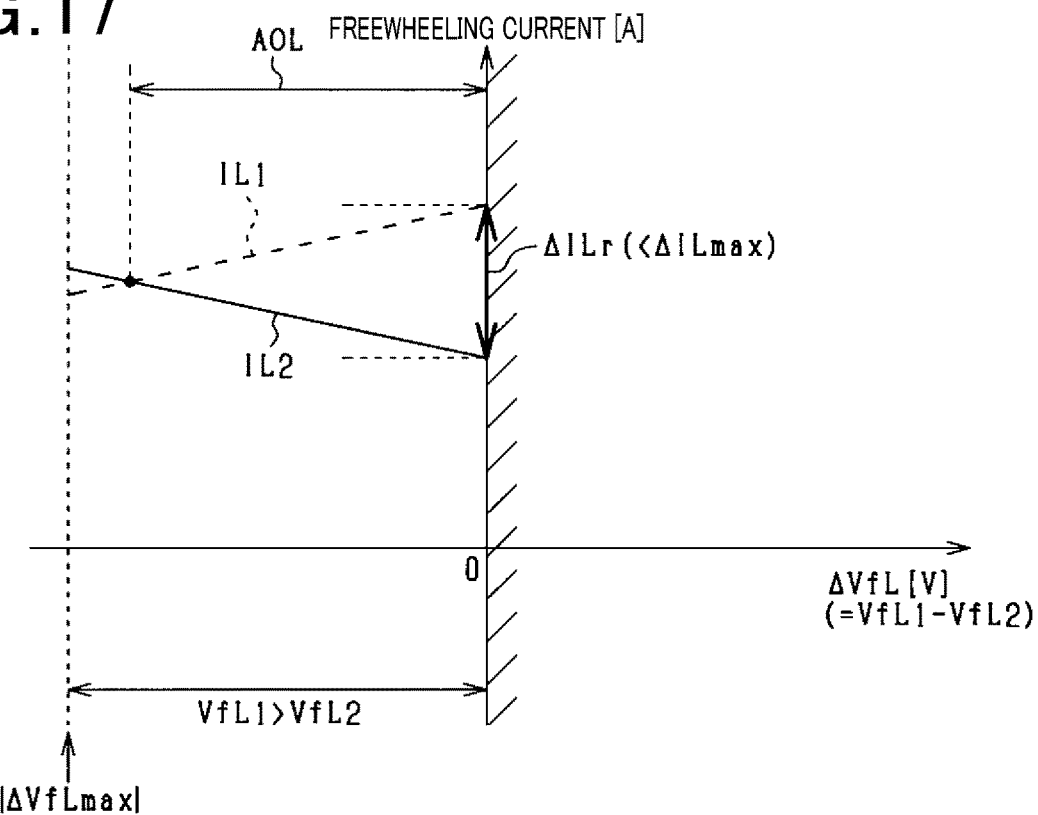
FIG. 17 is an example of defining diode characteristics.

The current-voltage characteristics of the first and second lower arm diodes DL1, DL2 and the respective impedances RO1, RO2, RN1, RN2 may be defined as shown in FIG. 17. In the example of FIG. 17, (RO2+RN2) minus (RO1+RN1) is greater than in the example of FIG. 16.

The current-voltage characteristics of the first and second lower arm diodes DL1, DL2 and the impedances RO1, RO2, RN1, RN2 may be set in the following manner. For example, given variations in the current-voltage characteristics of the diodes, each impedance may be changed. For example, given variations in the impedances, the current-voltage characteristics of the diodes may be changed.

The upper arm side will now be described. The upper arm side employs the following conditions (A2)-(C2).

(A2) As shown in FIG. 15, the first intermediate voltage impedance RO1 is set less than the second intermediate voltage impedance RO2, and the first high voltage impedance RP1 is set less than the second high voltage impedance RP2.

(B2) As shown FIG. 15, the voltage drop VfH1 across the first upper arm diode DH1 is set less than the voltage drop VfH2 across the second upper arm diode DH2 when a freewheeling current flows through each of the first and second upper arm diodes DH1, DH2.

(C2) The current-voltage characteristics of the first and second upper arm diodes DH1, DH2 and the respective impedances RO1, RO2, RP1, RP2 are defined such that an absolute difference value between the voltage drop VfH1 across the first upper arm diode DH1 and the voltage drop VfH2 across the second upper arm diode DH2 when a freewheeling current flows through each of the first and second upper arm diodes DH1, DH2 is set equal to or less than an absolute difference value between the voltage drop VfH1 across the first upper arm diode DH1 and the voltage drop VfH2 across the second upper arm diode DH2 under assumption that the freewheeling current flowing through the first upper arm diode DH1 is as large as the freewheeling current flowing through the second upper arm diode DH2. When the freewheeling current through each of the first and second upper arm diodes DH1, DH2 is IMH, the condition (C2) means that the following equation (4) is met.

$$\Delta VfH \leq IMH \times \{(RO2+RP2)-(RO1+RP1)\} \qquad (eq\ 4)$$

In the equation (4), ΔVfH is an upper arm potential difference. The upper arm potential difference ΔVfH is the voltage drop VfH1 across the first upper arm diode DH1 minus the voltage drop VfH2 across the second upper arm diode DH2.

With the conditions (A2)-(C2), the current-voltage characteristics of the first and second upper arm diodes DH1, DH2 and the respective impedances RO1, RO2, RP1, RP2 are defined such that a maximum value ΔIHr of an absolute difference between the freewheeling current IH1 through the first upper arm diode DH1 and the freewheeling current IH2 through the second upper arm diode DH2 is less than an upper arm maximum current difference ΔIHmax. The upper arm maximum current difference ΔIHmax is a maximum value of an absolute difference between the freewheeling current IH1 through the first upper arm diode DH1 and the freewheeling current IH2 through the second upper arm diode DH2 under assumption that RO1=RO2 and RP1=RP2.

In the present embodiment, on the lower arm side, the low-voltage power source terminal TCN corresponds to a freewheeling current input. The intermediate terminal TO corresponds to a freewheeling current output. The first lower arm diode DL1 corresponds to a minimum diode. The second lower arm diode DL2 corresponds to a maximum diode. The electrical path from the low-voltage power source terminal TCN to the intermediate terminal TO of the semiconductor module MS including the second lower arm diode DL2 via the low voltage conductive member Bn, the low voltage connection 30n, the switch low-voltage terminal TN, and the second lower arm diode DL2, corresponds to a maximum path. The electrical path from the low-voltage power source terminal TCN to the intermediate terminal TO of the semiconductor module MS including the first lower arm diode DL1 via the low voltage conductive member Bn, the low voltage connection 30n, the switch low-voltage terminal TN, and the first lower arm diode DL1, corresponds to a minimum path.

In the present embodiment, on the upper arm side, the intermediate terminal TO corresponds to a freewheeling current input. The high-voltage power source terminal TCP corresponds to a freewheeling current output. The first upper arm diode DH1 corresponds to a minimum diode. The second upper arm diode DH2 corresponds to a maximum diode. The electrical path from the intermediate terminal TO of the semiconductor module MS including the second upper arm diode DH2 to the high-voltage power source terminal TCP via the second upper arm diode DH2, the switch high-voltage terminal TP, the high-voltage connection 30p, and the high-voltage conductive member Bp, corresponds to a maximum path. The electrical path from the intermediate terminal TO of the semiconductor module MS including the first upper arm diode DH1 to the high-voltage power source terminal TCP via the first upper arm diode DH1, the switch high-voltage terminal TP, the high-voltage connection 30p, and the high-voltage conductive member Bp, corresponds to a minimum path.

Continuing with the lower arm example, the configuration of the present embodiment set forth above can suppress variations in impedance with the freewheeling current path from the low-voltage power source terminal TCN to the intermediate terminal TO via the first lower arm diode DL1 and the freewheeling current path from the low-voltage power source terminal TCN to the intermediate terminal TO via the second lower arm diode DL2. Therefore, variations in voltage drop generated when a freewheeling current flows through each of the freewheeling current paths with the freewheeling current paths can be suppressed. This can suppress variations in difference between the freewheeling current values IL1, IL2, and can therefore suppress variations in timing of completion of passage of the recovery current with the freewheeling current paths. As a result, variations in potential difference between the emitters of the first and second lower arm switches SL1, SL2 can be suppressed.

Second Embodiment

A second embodiment is similar in configuration to the first embodiment. Therefore, only differences of the second embodiment from the first embodiment will be described. In the present embodiment, instead of the condition (C1) set forth above, a condition (D1) is employed on the lower arm side.

Figure 18:
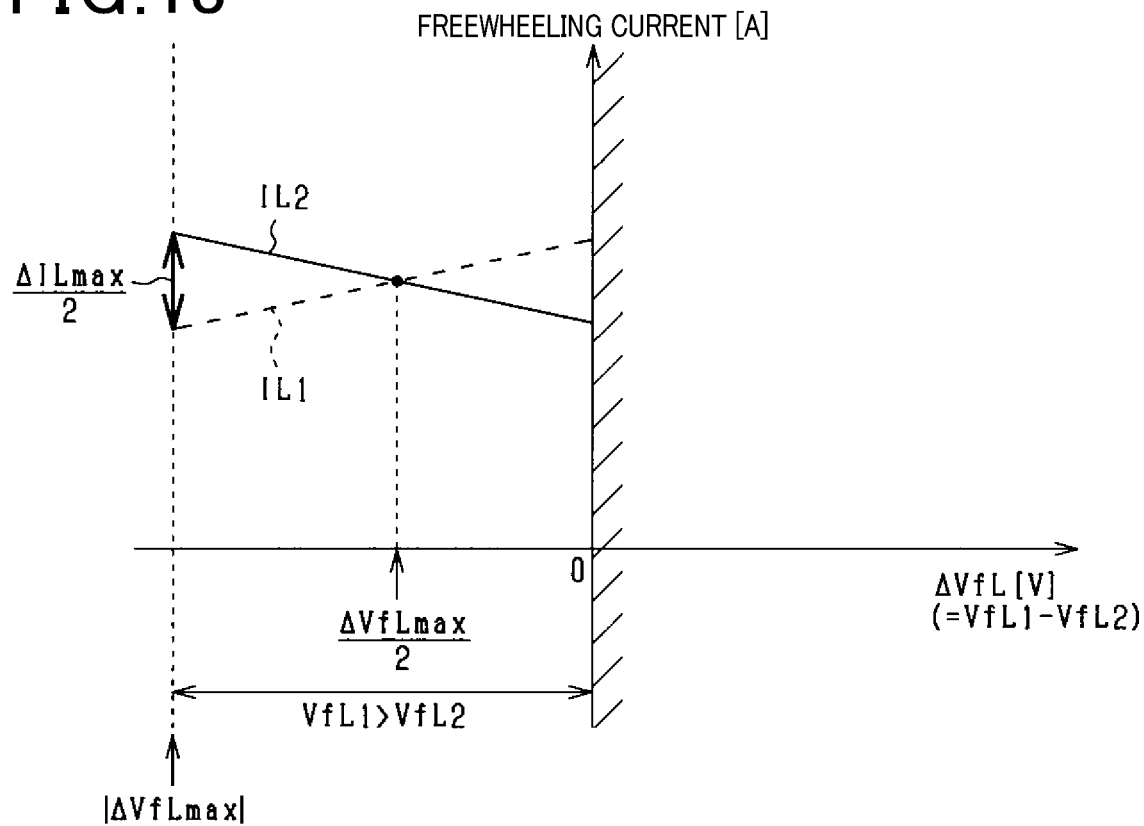
FIG. 18 is an example of defining diode characteristics in accordance with a second embodiment.

(D1) As shown in FIG. 18, the current-voltage characteristics of the first and second lower arm diodes DL1, DL2 and the respective impedances RO1, RO2, RN1, RN2 are defined such that an absolute difference value between the voltage drop VfL1 across the first lower arm diode DL1 and the voltage drop VfL2 across the second lower arm diode DL2 when a freewheeling current flows through each of the first and second lower arm diodes DL1, DL2 is set equal to an absolute difference value between the voltage drop VfL1 across the first lower arm diode DL1 and the voltage drop VfL2 across the second lower arm diode DL2 under assumption that the freewheeling current flowing through the first lower arm diode DL1 is as large as the freewheeling current flowing through the second lower arm diode DL2. Particularly, in the present embodiment, the current-voltage characteristics of the first and second lower arm diodes DL1,DL2 are defined such that $\Delta VfL=\Delta VfLmax/2$, where the following equation (5) is met.

$$\frac{\Delta VfL_{max}}{2} = IML \times \{(RO2 + RN2) - (RO1 + RN1)\} \quad \text{(eq 5)}$$

In the present embodiment, the current-voltage characteristics of the first and second lower arm diodes DL1, DL2 and the respective impedances RO1, RO2, RN1, RN2 are defined such that a maximum value of an absolute difference between the freewheeling current IL1 and the freewheeling current IL2 is equal to or less than the lower arm maximum current difference $\Delta ILmax/2$.

The upper arm side employs a condition (D2) instead of (C2).

(D2) The current-voltage characteristics of the first and second upper arm diodes DH1, DH2 and the respective impedances RO1, RO2, RP1, RP2 are defined such that an absolute difference value between the voltage drop VfH1 across the first upper arm diode DH1 and the voltage drop VfH2 across the second upper arm diode DH2 when a freewheeling current flows through each of the first and second upper arm diodes DH1, DH2 is set equal to an absolute difference value between the voltage drop VfH1 across the first upper arm diode DH1 and the voltage drop VfH2 across the second upper arm diode DH2 under assumption that the freewheeling current flowing through the first upper arm diode DH1 is as large as the freewheeling current flowing through the second upper arm diode DH2. Particularly, in the present embodiment, the current-voltage characteristics of the first and second upper arm diodes DH1, DH2 are defined such that $\Delta VfH=\Delta VfHmax/2$, where the following equation (6) is met.

$$\frac{\Delta VfH_{max}}{2} = IMH \times \{(RO2 + RP2) - (RO1 + RP1)\} \quad \text{(eq 6)}$$

$\Delta VfH=|\Delta VfHmax|$ means that the current-voltage characteristic of the first upper arm diode DH1 is the maximum characteristic Vfmax and the current-voltage characteristic of the second upper arm diode DH2 is the minimum characteristic Vfmin. $\Delta VfHmax$ is hereinafter referred to as an upper arm maximum potential difference $\Delta VfHmax$.

In the present embodiment, the current-voltage characteristics of the first and second upper arm diodes DH1, DH2 and the respective impedances RO1, RO2, RP1, RP2 are defined such that a maximum value of an absolute difference between the freewheeling current IH1 and the freewheeling current IH2 is equal to or less than the upper arm maximum potential difference $\Delta IHmax/2$.

Continuing with the lower arm example, the configuration of the present embodiment set forth above can eliminate imbalances between the freewheeling current values IL1, IL2. As a result, variations in potential difference between the emitters of the first and second lower arm switches SL1, SL2 can be further suppressed.

Third Embodiment

Figure 19:
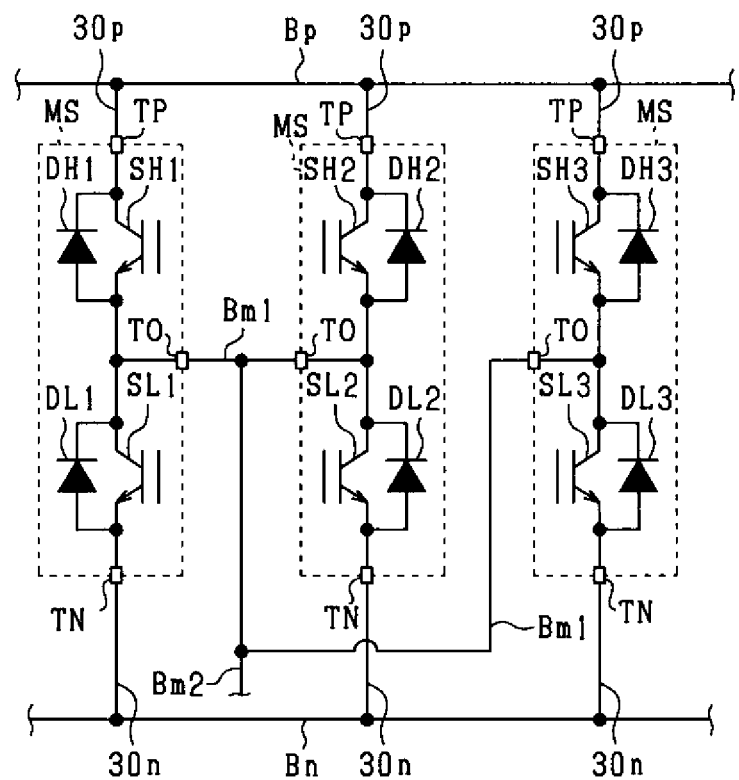
FIG. 19 is a circuit diagram of an inverter for one of the three phases in accordance with a third embodiment.

A third embodiment is similar in configuration to the first embodiment. Therefore, only differences of the third embodiment from the first embodiment will be described. In the present embodiment, as shown in FIG. 19, for each of the three phases, each of the upper and lower arms includes three switches. FIG. 19 illustrates a circuit diagram of the inverter 20 for one of the three phases. In FIG. 19, the same elements as shown in FIG. 1 are assigned the same numbers for simplicity.

The inverter 20 further includes, for each of of the three phases, a series connection of a third upper arm switch SH3 and a third lower arm switch SL3. In the present embodiment, each switch SH3, SL3 is a voltage control type semiconductor switch element, more specifically, an insulated gate bipolar transistor (IGBT).

A third upper arm diode DH3 is electrically connected in anti-parallel with the third upper arm switch SH3. A third lower arm diode DL3 is electrically connected in anti-parallel with the third lower arm switch SL3. Each of the diodes DH3, DL3 may be integrated within a corresponding one of the switches SH3, SL3 to provide an IGBT with a built-in diode or may be external to a corresponding one of the switches SH3, SL3. In the present embodiment, the third upper arm switch SH3, the third upper arm diode DH3, the third lower arm switch SL3, and the third lower arm diode DL3 are enclosed and integrated within a casing to provide a semiconductor module MS.

For each of the three phases, intermediate terminals TO of the three semiconductor modules MS are electrically connected to a first conductive connection Bm1. The first connection Bm1 is electrically connected to a first end of a winding 21A of the rotary electric machine 21 via a second conductive connection Bm2.

In the present embodiment, an upper arm drive circuit DrH drives the first to third upper arm switches SH1-SH3. In the present embodiment, the first to third upper arm switches SH1-SH3 are on-off driven in synchronization with each other. The lower arm drive circuit DrL drives the first to third lower arm switches SL1-SL3. In the present embodiment, the first to third lower arm switches SL1-SL3 are on-off driven in synchronization with each other.

Figure 20:
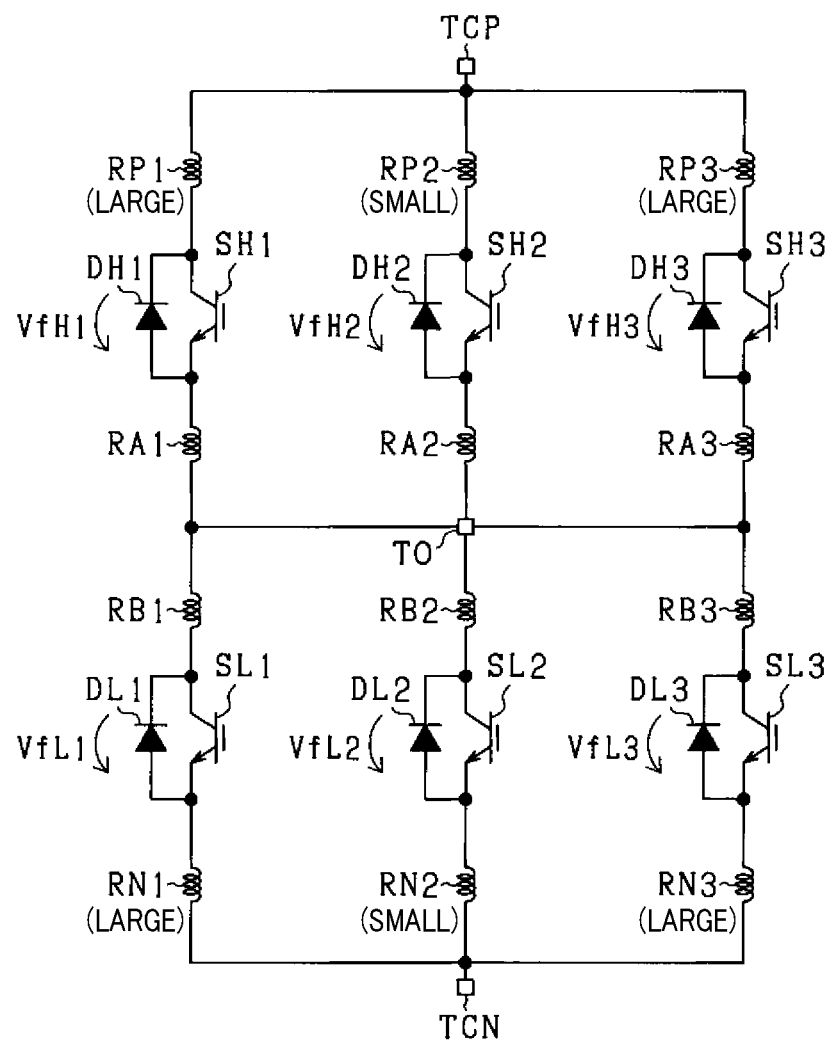
FIG. 20 is an example of defining diode characteristics.

FIG. 20 illustrates a configuration for any one of the three phases. For sake of simplicity, in FIG. 20, the intermediate terminal TO of the semiconductor module MS including the first upper and lower arm switches SH1, SL1, the intermediate terminal TO of the semiconductor module MS including the second upper and lower arm switches SH2, SL2, and the intermediate terminal TO of the semiconductor module MS including the third upper and lower arm switches SH3, SL3 are represented by a single intermediate terminal TO. In addition, in FIG. 20, a voltage drop across the third lower arm diode DL3 is denoted by VfL3(IL3), a voltage drop across the third upper arm diode DH3 is denoted by VfH3(IH3). IL3 represents a value of freewheeling current through the third lower arm diode DL3. IH3 represents a value of freewheeling current through the third upper arm diode DH3.

FIG. 20 illustrates an impedance of each electrical path. Descriptions of FIG. 20 overlapping with the descriptions of FIG. 7 will be mitted.

As shown in FIG. 20, a third high-voltage impedance RP3 is an impedance of an electrical path from the high-voltage power source terminal TCP to the collector of the third upper arm switch SH3 via the high-voltage conductive member Bp, the high-voltage connection 30p, and the switch high-voltage terminal TP of the semiconductor module MS including the third upper arm diode DH3.

A first intermediate voltage impedance RA1 is an impedance of an electrical path from the intermediate terminal TO to the emitter of the first upper arm switch SH1 in the semiconductor module MS including the first upper arm diode DH1. A second intermediate voltage impedance RA2 is an impedance of an electrical path from the intermediate terminal TO to the emitter of second upper arm switch SH2 in the semiconductor module MS including the second upper arm diode DH2. A third intermediate voltage impedance RA3 is an impedance of an electrical path from the intermediate terminal TO to the emitter of the third upper arm switch SH3 in the semiconductor module MS including the third upper arm diode DH3.

A fourth intermediate voltage impedance RB1 is an impedance of an electrical path from the intermediate terminal TO to the collector of the first lower arm switch SL1 in the semiconductor module MS including the first lower arm diode DL1. A fifth intermediate voltage impedance RB2 is an impedance of an electrical path from the intermediate terminal TO to the collector of the second lower arm switch SL2 in the semiconductor module MS including the second lower arm diode DL2. A sixth intermediate voltage impedance RB3 is an impedance of an electrical path from the intermediate terminal TO to the collector of the third lower arm switch SL3 in the semiconductor module MS including the third lower arm diode DL3.

A third low voltage impedance RN3 is an impedance of an electrical path from the lower-voltage power source terminal TCN to the emitter of the third lower arm switch SL3 via the low voltage conductive member Bn, the low voltage connection 30n, and the switch low-voltage terminal TN of the semiconductor module MS including the third lower arm diode DL3.

To reduce a maximum value of an absolute difference between the freewheeling currents, the configuration of the present embodiment will now be described.

For each of the three phases, the lower arm side employs the following conditions (E1)-(G1).

(E1) The impedances are defined such that $RB1=RB3>RB2$ and $RN1=RN3>RN2$.

(F1) The current-voltage characteristics of the respective lower arm diodes DL1-DL3 are defined such that voltage drops VfL1-VfL3 across the respective lower arm diodes DL1-DL3 when a freewheeling current flows through each of the first to third lower arm diodes DL1-DL3 satisfy the following relation: $VfL1=VfL3<VfL2$.

(G1) The current-voltage characteristics of the respective lower arm diodes DL1-DL3 and the respective impedances RB1-RB3 and RN1-RN3 are defined such that an absolute difference value between the voltage drop VfL1 across the first lower arm diode DL1 and the voltage drop VfL2 across the second lower arm diode DL2 when a freewheeling current flows through each of the lower arm diodes DL1-DL3 is set equal to or less than an absolute difference value between the voltage drop VfL1 across the first lower arm diode DL1 and the voltage drop VfL2 across the second lower arm diode DL2 under assumption that an equal current flows through each of the lower arm diodes DL1-DL3, i.e., $IL1=IL2=IL3$. IL1 represents a value of freewheeling current flowing through the lower arm diode DL1. IL2 represents a value of freewheeling current flowing through the lower arm diode DL2. IL3 represents a value of freewheeling current flowing through the lower arm diode DL3.

For each of the three phases, the upper arm side employs the following conditions (E2)-(G2).

(E2) The impedances are defined such that $RA1=RA3>RA2$ and $RP1=RP3>RP2$.

(F2) The current-voltage characteristics of the respective upper arm diodes DH1-DH3 are defined such that voltage drops VfH1-VfH3 across the respective upper arm diodes DH1-DH3 when a freewheeling current flows through each of the first to third upper arm diodes DH1-DH3 satisfy the following relation: $VfH1=VfH3<VfH2$.

(G2) The current-voltage characteristics of the respective upper arm diodes DH1-DH3 and the respective impedances RA1-RA3 and RP1-RP3 are defined such that an absolute difference value between the voltage drop VfH1 across the first upper arm diode DH1 and the voltage drop VfH2 across the second upper arm diode DH2 when a freewheeling current flows through each of the upper arm diodes DH1-DH3 is set equal to or less than an absolute difference value between the voltage drop VfH1 across the first upper arm diode DH1 and the voltage drop VfH2 across the second upper arm diode DH2 under assumption that an equal current flows through each of the upper arm diodes DH1-DH3, i.e., $IH1=IH2=IH3$. IH1 represents a value of freewheeling current flowing through the upper arm diode DH1. IH2 represents a value of freewheeling current flowing through the upper arm diode DH2. IH3 represents a value of freewheeling current flowing through the upper arm diode DH3.

In the present embodiment, on the lower arm side, the second lower arm diode DL2 corresponds to a minimum diode. Each of the first and third lower arm diodes DL1, DL3 corresponds to a maximum diode. The electrical path from the low-voltage power source terminal TCN to the intermediate terminal TO of the semiconductor module MS including the first lower arm diode DL1 via the low voltage conductive member Bn, the low voltage connection 30n, the switch low-voltage terminal TN, and the first lower arm diode DL1, corresponds to a maximum path. The electrical path from the low-voltage power source terminal TCN to the intermediate terminal TO of the semiconductor module MS including the third lower arm diode DL3 via the low voltage conductive member Bn, the low voltage connection 30n, the switch low-voltage terminal TN, and the third lower arm diode DL3, corresponds to a maximum path. The electrical path from the low-voltage power source terminal TCN to the intermediate terminal TO of the semiconductor module MS including the second lower arm diode DL2 via the low voltage conductive member Bn, the low voltage connection 30n, the switch low-voltage terminal TN, and the second lower arm diode DL2, corresponds to a minimum path.

In the present embodiment, on the upper arm side, the second upper arm diode DH2 corresponds to a minimum diode. Each of the first and third upper arm diodes DH1, DH3 corresponds to a maximum diode. The electrical path from the intermediate terminal TO of the semiconductor module MS including the first upper arm diode DH1 to the high-voltage power source terminal TCP via the first upper arm diode DH1, the switch high-voltage terminal TP, the high-voltage connection 30p, and the high-voltage conductive member Bp, corresponds to a maximum path. The electrical path from the intermediate terminal TO of the semiconductor module MS including the third upper arm diode DH3 to the high-voltage power source terminal TCP via the third upper arm diode DH3, the switch high-voltage terminal TP, the high-voltage connection 30p, and the high-voltage conductive member Bp, corresponds to a maximum path. The electrical path from the intermediate terminal TO of the semiconductor module MS including the second upper arm diode DH2 to the high-voltage power source terminal TCP via the second upper arm diode DH2, the switch high-voltage terminal TP, the high-voltage connection 30p, and the high-voltage conductive member Bp, corresponds to a minimum path.

With the configuration of the present embodiment set forth above, variations in potential difference between the emitters of the first to third lower arm switches SL1-SL3 and variations in potential difference between the emitters of the first to third upper arm switches SH1-SH3 can be suppressed.

Forth Embodiment

Figure 21:
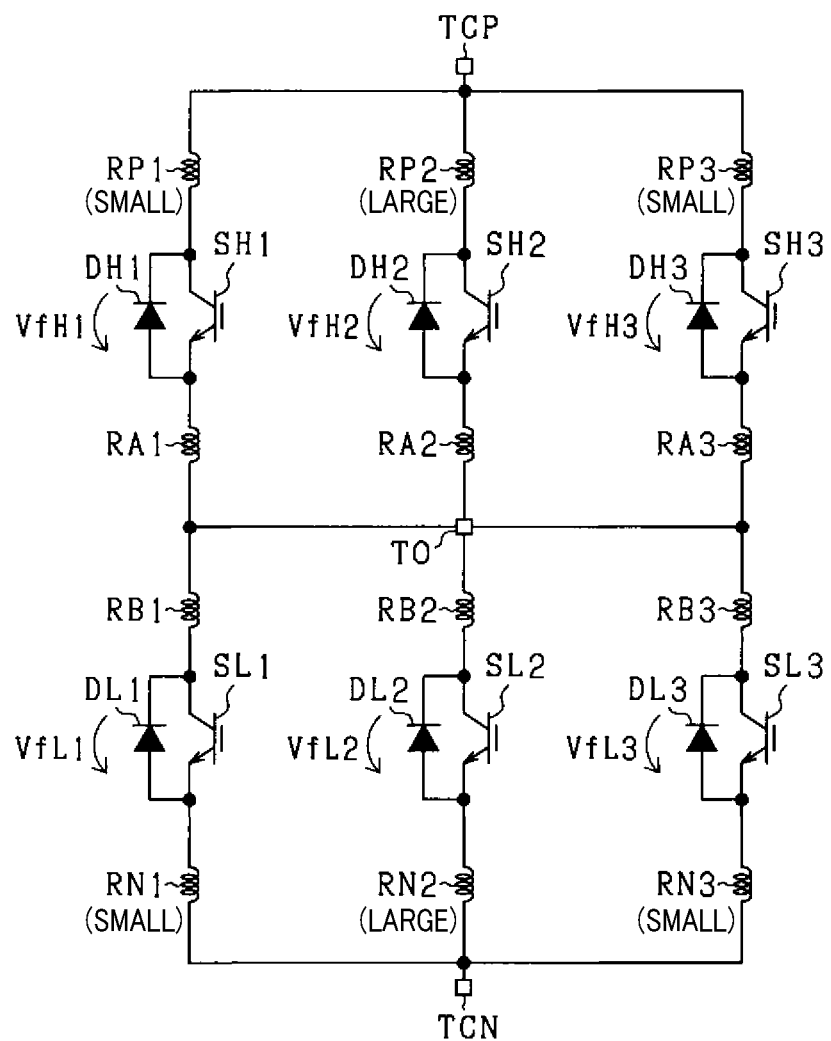
FIG. 21 is an example of defining diode characteristics in accordance with a fourth embodiment.

A fourth embodiment is similar in configuration to the third embodiment. Therefore, only differences of the fourth embodiment from the third embodiment will be described. In the present embodiment, as shown in FIG. 21, settings of the respective impedances and the current-voltage characteristics of the respective diode are modified.

For each of the three phases, the lower arm side employs the following conditions (H1)-(I1) and (G1) set forth above.

(H1) The impedances are defined such that RB1=RB3<RB2 and RN1=RN3<RN2.

(I1) The current-voltage characteristics of the respective lower arm diodes DL1-DL3 are defined such that voltage drops VfL1-VfL3 across the respective lower arm diodes DL1-DL3 when a freewheeling current flows through each of the first to third lower arm diodes DL1-DL3 satisfy the following relation: VfL1=VfL3>VfL2.

For each of the three phases, the upper arm side employs the following conditions (H2)-(I2) and (G2) set forth above.

(H2) The impedances are defined such that RA1=RA3<RA2 and RP1=RP3<RP2.

(I2) The current-voltage characteristics of the respective upper arm diodes DH1-DH3 are defined such that voltage drops VfH1-VfH3 across the respective upper arm diodes DH1-DH3 when a freewheeling current flows through each of the first to third upper arm diodes DH1-DH3 satisfy the following relation: VfH1=VfH3>VfH2.

In the present embodiment, on the lower arm side, each of the first and third lower arm diodes DL1, DL3 corresponds to a minimum diode. The second lower arm diode DL2 corresponds to a maximum diode. The electrical path from the low-voltage power source terminal TCN to the intermediate terminal TO of the semiconductor module MS including the second lower arm diode DL2 via the low voltage conductive member Bn, the low voltage connection 30n, the switch low-voltage terminal TN, and the second lower arm diode DL2, corresponds to a maximum path. The electrical path from the low-voltage power source terminal TCN to the intermediate terminal TO of the semiconductor module MS including the first lower arm diode DL1 via the low voltage conductive member Bn, the low voltage connection 30n, the switch low-voltage terminal TN, and the first lower arm diode DL1, corresponds to a minimum path. The electrical path from the low-voltage power source terminal TCN to the intermediate terminal TO of the semiconductor module MS including the third lower arm diode DL3 via the low voltage conductive member Bn, the low voltage connection 30n, the switch low-voltage terminal TN, and the third lower arm diode DL3, corresponds to a minimum path.

In the present embodiment, on the upper arm side, each of the first and third upper arm diodes DH1, DH3 corresponds to a minimum diode. The second upper arm diode DH2 corresponds to a maximum diode. The electrical path from the intermediate terminal TO of the semiconductor module MS including the second upper arm diode DH2 to the high-voltage power source terminal TCP via the second upper arm diode DH2, the switch high-voltage terminal TP, the high-voltage connection 30p, and the high-voltage conductive member Bp, corresponds to a maximum path. The electrical path from the intermediate terminal TO of the semiconductor module MS including the first upper arm diode DH1 to the high-voltage power source terminal TCP via the first upper arm diode DH1, the switch high-voltage terminal TP, the high-voltage connection 30p, and the high-voltage conductive member Bp, corresponds to a maximum path. The electrical path from the intermediate terminal TO of the semiconductor module MS including the third upper arm diode DH3 to the high-voltage power source terminal TCP via the third upper arm diode DH3, the switch high-voltage terminal TP, the high-voltage connection 30p, and the high-voltage conductive member Bp, corresponds to a minimum path.

The present embodiment can provide similar advantages to those of the third embodiment.

Fifth Embodiment

Figure 22:
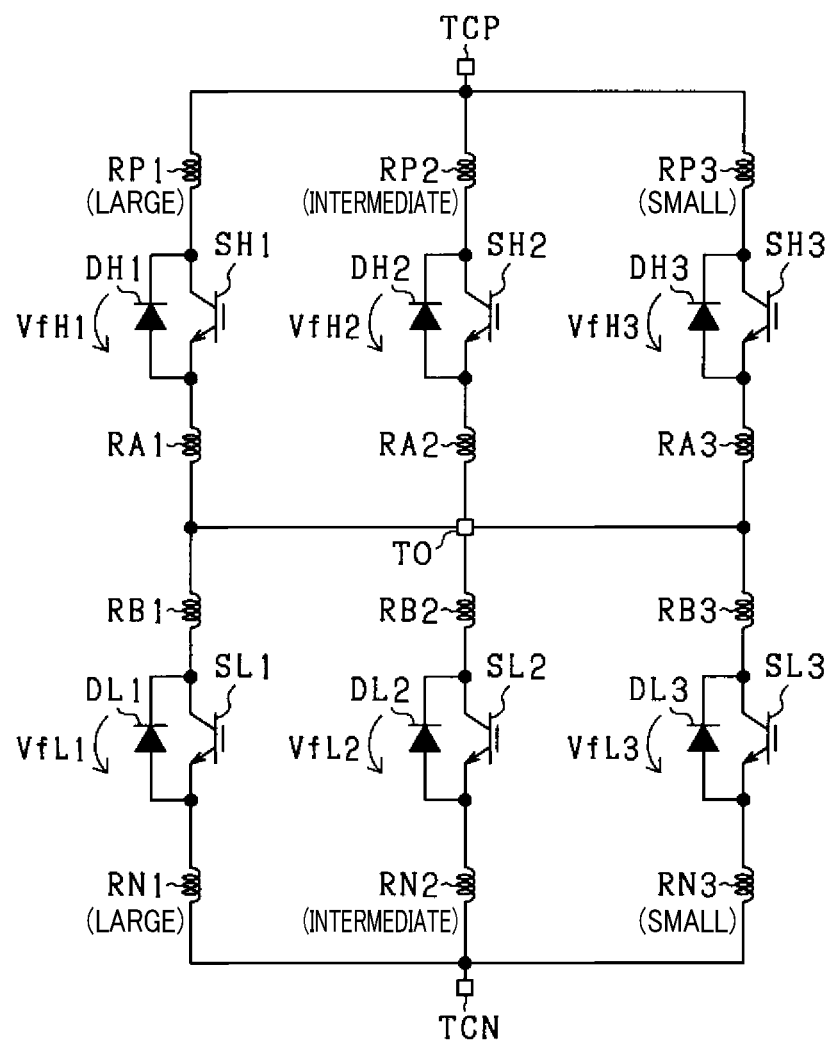
FIG. 22 is an example of defining diode characteristics in accordance with a fifth embodiment.

A fifth embodiment is similar in configuration to the third embodiment. Therefore, only differences of the fifth embodiment from the third embodiment will be described. In the present embodiment, as shown in FIG. 22, settings of the respective impedances and the current-voltage characteristics of the respective diode are modified.

For each of the three phases, the lower arm side employs the following conditions (J1)-(L1).

(J1) The impedances are defined such that RB1>RB2>RB3 and RN1>RN2>RN3.

(K1) The current-voltage characteristics of the respective lower arm diodes DL1-DL3 are defined such that voltage drops VfL1-VfL3 across the respective lower arm diodes DL1-DL3 when a freewheeling current flows through each of the first to third lower arm diodes DL1-DL3 satisfy the following relation: VfL1<VfL2<VfL3.

(L1) The current-voltage characteristics of the respective lower arm diodes DL1-DL3 and the respective impedances RB1-RB3 and RN1-RN3 are defined such that an absolute difference value between the voltage drop VfL1 across the first lower arm diode DL1 and the voltage drop VfL3 across the third lower arm diode DL3 when a freewheeling current flows through each of the lower arm diodes DL1-DL3 is set equal to or less than an absolute difference value between the voltage drop VfL1 across the first lower arm diode DL1 and the voltage drop VfL3 across the third lower arm diode DL3 under assumption that an equal current flows through each of the lower arm diodes DL1-DL3, i.e., IL1=IL2=IL3.

For each of the three phases, the upper arm side employs the following conditions (J2)-(L2).

(J2) The impedances are defined such that RA1>RA2>RA3 and RP1>RP2>RP3.

(K2) The current-voltage characteristics of the respective upper arm diodes DH1-DH3 are defined such that voltage drops VfH1-VfH3 across the respective upper arm diodes DH1-DH3 when a freewheeling current flows through each of the first to third upper arm diodes DH1-DH3 satisfy the following relation: VfH1<VfH2<VfH3.

(L2) The current-voltage characteristics of the respective upper arm diodes DH1-DH3 and the respective impedances RA1-RA3 and RP1-RP3 are defined such that an absolute difference value between the voltage drop VfH1 across the first upper arm diode DH1 and the voltage drop VfH3 across the third upper arm diode DH3 when a freewheeling current flows through each of the upper arm diodes DH1-DH3 is set equal to or less than an absolute difference value between the voltage drop VfH1 across the first upper arm diode DH1 and the voltage drop VfH3 across the third upper arm diode DH3 under assumption that an equal current flows through each of the upper arm diodes DH1-DH3, i.e., IH1=IH2=IH3.

In the present embodiment, on the lower arm side, the third lower arm diodes DL3 corresponds to a minimum diode. The first lower arm diode DL1 corresponds to a maximum diode. The electrical path from the low-voltage power source terminal TCN to the intermediate terminal TO of the semiconductor module MS including the first lower arm diode DL1 via the low voltage conductive member Bn, the low voltage connection 30n, the switch low-voltage terminal TN, and the first lower arm diode DL1, corresponds to a maximum path. The electrical path from the low-voltage power source terminal TCN to the intermediate terminal TO of the semiconductor module MS including the third lower arm diode DL3 via the low voltage conductive member Bn, the low voltage connection 30n, the switch low-voltage terminal TN, and the third lower arm diode DL3, corresponds to a minimum path.

In the present embodiment, on the upper arm side, the third upper arm diodes DH3 corresponds to a minimum diode. The first upper arm diode DH1 corresponds to a maximum diode. The electrical path from the intermediate terminal TO of the semiconductor module MS including the first upper arm diode DH1 to the high-voltage power source terminal TCP via the first upper arm diode DH1, the switch high-voltage terminal TP, the high-voltage connection 30p, and the high-voltage conductive member Bp, corresponds to a maximum path. The electrical path from the intermediate terminal TO of the semiconductor module MS including the third upper arm diode DH3 to the high-voltage power source terminal TCP via the third upper arm diode DH3, the switch high-voltage terminal TP, the high-voltage connection 30p, and the high-voltage conductive member Bp, corresponds to a maximum path.

The present embodiment set forth above in detail can provide similar advantages to those of the third embodiment.

Sixth Embodiment

Figure 23:
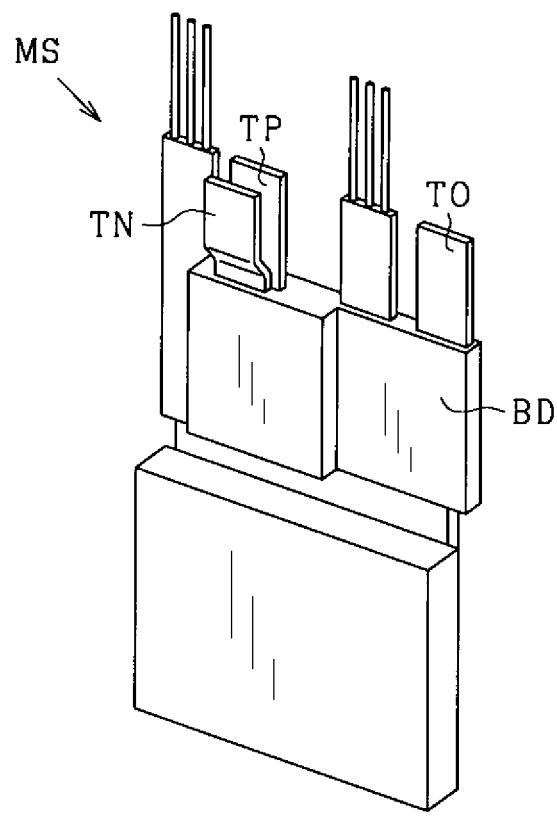
FIG. 23 is a perspective view of a semiconductor module in accordance with a sixth embodiment.
Figure 24:
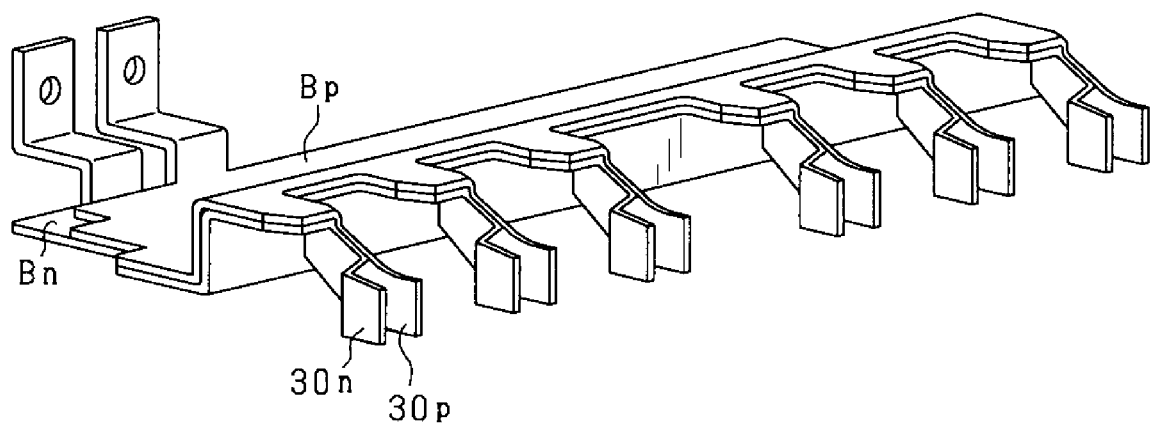
FIG. 24 is a perspective view of connections for semiconductor modules.

A sixth embodiment of the present disclosure will now be described with reference to FIGS. 23 and 24. In FIGS. 23 and 24, the configuration of each of the semiconductor module MS and the conductive members Bp, Bn of the first embodiment is modified. In FIG. 24, an electrically insulating film or sheet (not shown) may be interposed between the high-voltage conductive member Bp and the low voltage conductive member Bn.

The present embodiment can provide similar advantages to those of the first embodiment.

Modifications

It is to be understood that the invention is not to be limited to the specific embodiments disclosed above and that modifications and other embodiments are intended to be included within the scope of the appended claims.

(M1) In a first modification, referring to FIG. 16, on either or both of the lower and upper arm side, the current-voltage characteristics of the first and second lower arm diodes DL1, DL2 may be set within the range ADX on the condition that a maximum value of an absolute difference between the freewheeling current IL1 and the freewheeling current IL2 is less than the lower arm maximum current difference ΔILmax.

(M2) In a second modification, the configuration of the second embodiment may be applied to each of the third to fifth embodiments.

(M3) In a third modification, setting techniques set forth above for the impedances and the diode characteristics to prevent occurrence of the imbalance phenomenon may be applied to only one of the lower and upper arm sides.

(M4) In each of the third to fifth embodiments, the number of switches may be greater than three on each of the upper and lower arm sides.

(M5) In a fifth modification, each of the switches forming the power converter may be an N-channel MOSFET. In this modification, the control terminal is a gate of the N-channel MOSFET, the input terminal is a drain of the N-channel MOSFET, and the output terminal is a source of the N-channel MOSFET. In addition, the freewheeling diode may be a parasitic diode of the N-channel MOSFET or a freewheeling diode external to the N-channel MOSFET.

(M6) In each of the above embodiments, the power converter is a three-phase power converter. In an alternative embodiment, the power converter may be a two-phase or four- or more-phase power converter. The power converter of each of the above embodiments is not limited to a vehicle-mounted power converter.

What is claimed is:

1. A power converter comprising:
a plurality of switches;
a plurality of freewheeling diodes, each of which is electrically connected in anti-parallel with a respective one of the switches;
a freewheeling current input electrically connected to an output terminal of each of the switches;
a freewheeling current output electrically connected to an input terminal of each of the switches,
wherein a plurality of freewheeling current paths are defined, each of which is an electrical path passing through a respective one of the freewheeling diodes from the freewheeling current input to the freewheeling current output, at least one of the plurality of freewheeling current paths is a maximum path having a maximum impedance among the freewheeling current paths, and a voltage drop across the freewheeling diode included in the maximum path is less than a voltage drop across each of the other freewheeling diodes when a freewheeling current flows through each of the plurality of freewheeling diodes.

2. The power converter according to claim 1, wherein at least one of the plurality of freewheeling current paths is a minimum path having a minimum impedance among the freewheeling current paths, and a voltage drop across the freewheeling diode included in the minimum path is greater than a voltage drop across each of the other freewheeling diodes when a freewheeling current flows through each of the plurality of freewheeling diodes.

3. The power converter according to claim 2, wherein
the freewheeling diode included in the minimum path is referred to as a minimum diode and the freewheeling diode included in the maximum path is referred to as a maximum diode,
current-voltage characteristics of the minimum diode and the maximum diode and impedances of the minimum path and the maximum path are defined such that an absolute difference value between a voltage drop across the maximum diode and a voltage drop across the minimum diode when a freewheeling current flows through each of the plurality of freewheeling diodes is equal to or less than an absolute difference value between a voltage drop across the maximum diode and a voltage drop across the minimum diode under assumption that an equal current flows through each of the minimum path and the maximum path.

4. The power converter according to claim 3, wherein current-voltage characteristics of the minimum diode and the maximum diode and impedances of the minimum path and the maximum path are defined such that an absolute difference value between a voltage drop across the maximum diode and a voltage drop across the minimum diode when a freewheeling current flows through each of the plurality of freewheeling diodes is equal to an absolute difference value between a voltage drop across the maximum diode and a voltage drop across the minimum diode under assumption that an equal current flows through each of the minimum path and the maximum path.

5. The power converter according to claim 3, wherein
a maximum characteristic is defined as a current-voltage characteristic of one of the plurality of freewheeling diodes that exhibits a maximum voltage drop at a specific value of freewheeling current,
a minimum characteristic is defined as a current-voltage characteristic of one of the plurality of freewheeling diodes that exhibits a minimum voltage drop at the specific value of freewheeling current,
a maximum current difference is a maximum value of an absolute difference between a maximum value of freewheeling current and a minimum value of freewheeling current under assumption that impedances of the respective freewheeling current paths are equal to each other and the plurality of freewheeling diodes includes a freewheeling diode having the minimum characteristic and a freewheeling diode having the maximum characteristic, and
current-voltage characteristics of the minimum diode and the maximum diode and impedances of the minimum path and the maximum path are defined such that a maximum value of an absolute difference between a maximum value of freewheeling current and a minimum value of freewheeling current is less than the maximum current difference.

6. A power converter comprising:
a plurality of switches;
a plurality of freewheeling diodes, each of which is electrically connected in anti-parallel with a respective one of the switches;
a freewheeling current input electrically connected to an output terminal of each of the switches;
a freewheeling current output electrically connected to an input terminal of each of the switches,
wherein a plurality of freewheeling current paths are defined, each of which is an electrical path passing through a respective one of the freewheeling diodes from the freewheeling current input to the freewheeling current output, at least one of the plurality of freewheeling current paths is a minimum path having a minimum impedance among the freewheeling current paths, and a voltage drop across the freewheeling diode included in the minimum path is greater than a voltage drop across each of the other freewheeling diodes when a freewheeling current flows through each of the plurality of freewheeling diodes.

* * * * *